(12) United States Patent
Kamada

(10) Patent No.: US 11,081,556 B2
(45) Date of Patent: Aug. 3, 2021

(54) SILICON CARBIDE SEMICONDUCTOR DEVICE

(71) Applicant: SUMITOMO ELECTRIC INDUSTRIES, LTD., Osaka (JP)

(72) Inventor: Hiroyuki Kamada, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 12 days.

(21) Appl. No.: 16/781,049

(22) Filed: Feb. 4, 2020

(65) Prior Publication Data

US 2020/0251564 A1 Aug. 6, 2020

(30) Foreign Application Priority Data

Feb. 6, 2019 (JP) .............................. JP2019-019800

(51) Int. Cl.
*H01L 29/417* (2006.01)
*H01L 29/78* (2006.01)
*H01L 29/16* (2006.01)

(52) U.S. Cl.
CPC .... *H01L 29/41741* (2013.01); *H01L 29/1608* (2013.01); *H01L 29/7813* (2013.01)

(58) Field of Classification Search
CPC ........... H01L 29/41741; H01L 29/1608; H01L 29/7813; H01L 29/7827
See application file for complete search history.

(56) References Cited

U.S. PATENT DOCUMENTS

| 6,054,343 A * | 4/2000 | Ashburn ........... H01L 21/76224 257/506 |
| 10,014,258 B2 | 7/2018 | Yamada et al. |
| 2003/0098497 A1* | 5/2003 | Solayappan ............ H01L 28/57 257/629 |
| 2012/0319134 A1* | 12/2012 | Honaga ............... H01L 29/7813 257/77 |
| 2015/0372094 A1* | 12/2015 | Horii .................. H01L 21/76802 257/77 |
| 2017/0194438 A1* | 7/2017 | Kumagai ........... H01L 29/1608 |
| 2017/0365624 A1* | 12/2017 | Sasaki ................. H01L 29/7869 |
| 2018/0358445 A1* | 12/2018 | Kobayashi .......... H01L 29/0623 |
| 2020/0013723 A1* | 1/2020 | Fuergut ............... H01L 29/1095 |
| 2020/0091299 A1* | 3/2020 | Nakamata .......... H01L 29/1095 |

FOREIGN PATENT DOCUMENTS

JP 2016-086064 5/2016

* cited by examiner

*Primary Examiner* — Douglas W Owens
(74) *Attorney, Agent, or Firm* — IPUSA, PLLC

(57) ABSTRACT

A silicon carbide semiconductor device includes a silicon carbide substrate, a gate insulating layer provided on a surface of the silicon carbide substrate, a gate electrode provided on the gate insulating layer, a first insulting layer provided on the gate electrode, a first layer provided on the first insulating layer, a second insulating layer provided on the first insulating layer, and an interconnect layer provided on the second insulating layer. The second insulating layer includes SiN or SiON. The first layer includes one of Ti, TiN, Ta, and TaN. The interconnect layer includes Al or Cu.

19 Claims, 17 Drawing Sheets

SILICON CARBIDE SEMICONDUCTOR DEVICE

CROSS-REFERENCE TO RELATED APPLICATIONS

This application is based upon and claims priority to Japanese Patent Application No. 2019-019800 filed on Feb. 6, 2019, the entire contents of which are incorporated herein by reference.

BACKGROUND OF THE INVENTION

1. Field of the Invention

Embodiments of the present disclosure are related to a silicon carbide semiconductor device.

2. Description of the Related Art

Because silicon carbide has a band gap wider than a band gap of silicon that is popularly used in conventional semiconductor devices, silicon carbide is used in high voltage semiconductor devices or the like. The semiconductor devices that use silicon carbide include the so-called vertical transistor having a source electrode formed on a first primary surface of a substrate, and a drain electrode formed on a second primary surface of the substrate, from a viewpoint of withstand voltage or the like.

An example of the silicon carbide semiconductor device is described in Japanese Laid-Open Patent Publication No. 2016-086064, for example.

In the silicon carbide semiconductor device that uses the silicon carbide semiconductor, a gate insulating layer may be formed on a surface of a silicon carbide epitaxial substrate, and a gate electrode made of polysilicon may be formed on the gate insulating layer. In the silicon carbide semiconductor device having such a structure, it may be difficult to obtain desired characteristics when a gate threshold voltage varies.

For this reason, in the silicon carbide semiconductor device, there are demands to reduce the variation of the gate threshold voltage.

SUMMARY OF THE INVENTION

One object of the embodiments of the present disclosure is to reduce the variation of the gate threshold voltage of the silicon carbide semiconductor device.

According to one aspect of the embodiments of the present disclosure, a silicon carbide semiconductor device includes a silicon carbide substrate; a gate insulating layer provided on a first surface of the silicon carbide substrate; a gate electrode provided on the gate insulating layer; a first insulting layer provided on the gate electrode; a first layer provided on the first insulating layer; a second insulating layer provided on the first insulating layer; and an interconnect layer provided on the second insulating layer, wherein the second insulating layer includes SiN or SiON, wherein the first layer includes one of Ti, TiN, Ta, and TaN, and wherein the interconnect layer includes Al or Cu.

Other objects and further features of the present disclosure will be apparent from the following detailed description when read in conjunction with the accompanying drawings.

DESCRIPTION OF THE EMBODIMENTS

Figure 1:
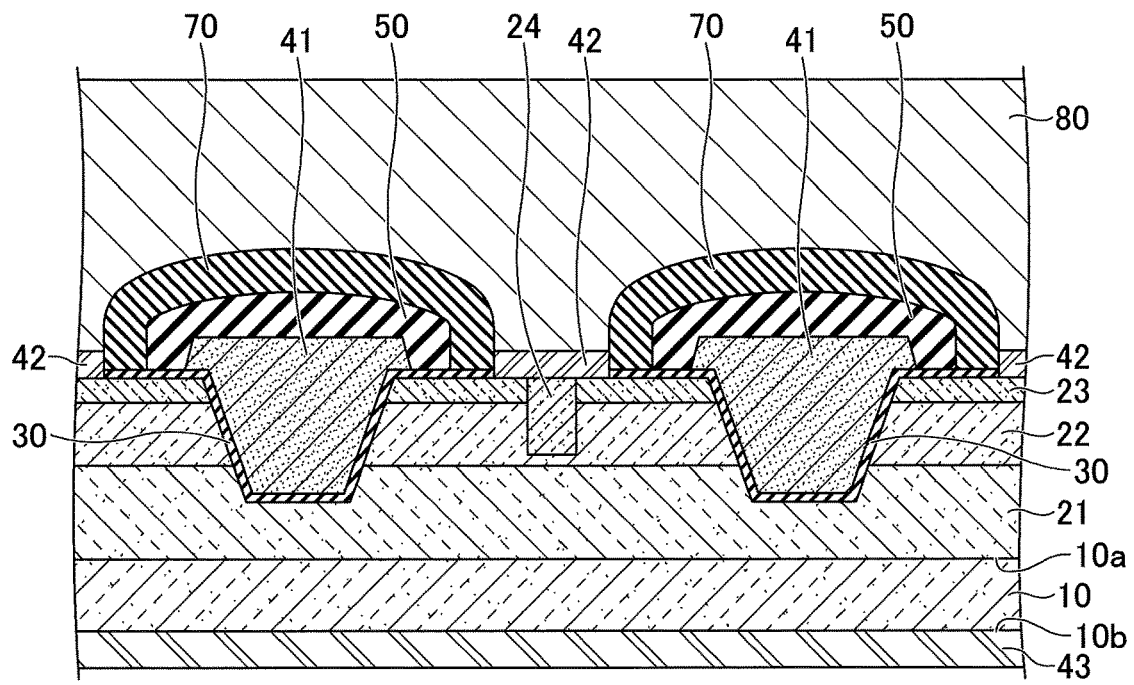
FIG. 1 is a structure diagram illustrating a silicon carbide semiconductor device.

Embodiments of the present disclosure will be described in the following.

The embodiments of the present disclosure will be described in an arbitrary order. In the following description, the same elements or corresponding elements will be described by the same reference numerals, and a repeated description of the same or corresponding elements will be omitted.

[1] A semiconductor device according to one embodiment of the present disclosure includes a silicon carbide substrate, a gate insulating layer provided on a first surface of the silicon carbide substrate, a gate electrode provided on the gate insulating layer, a first insulting layer provided on the gate electrode, a first layer provided on the first insulating layer, a second insulating layer provided on the first insulating layer, and an interconnect layer provided on the second insulating layer, wherein the second insulating layer includes SiN or SiON, wherein the first layer includes one of Ti, TiN, Ta, and TaN, and wherein the interconnect layer includes Al or Cu.

In the semiconductor device, such as a silicon carbide transistor or the like, including sodium (Na) that is referred to as mobile ions, a gate threshold voltage decreases in general when the semiconductor device is used at a high temperature of approximately 125° C. to approximately 175° C., to make it difficult to obtain the desired characteristics of the semiconductor device. Hence, a protection layer made of SiN or the like is provided, to prevent entry of or penetration by (hereinafter simply referred to as "entry of") Na from the outside. However, according to studies and experiments conducted by the present inventor, when the protection layer made of SiN or the like is provided in the silicon carbide transistor, a nitrogen component included in the SiN forming the protection layer diffuses to the inside of the semiconductor device during the manufacturing process of the semiconductor device. Further, it was found from results of the studies and experiments conducted by the present inventor that, among other things, the diffusion of the nitrogen component into the semiconductor device during the manufacturing process of the semiconductor device causes the gate threshold voltage to decrease during normal use or normal operation of the semiconductor device under room temperature, for example.

According to the present disclosure, the first layer made of TiN or the like is foisted on the first insulating layer that becomes an interlayer insulator provided on the gate electrode, and the second insulating layer that is made of SiN or the like and becomes a protection layer is formed on the first layer. Hence, it is possible to prevent the entry of Na into the semiconductor device, and also prevent the diffusion of the nitrogen component into the semiconductor device, to reduce the variation of the gate threshold voltage.

[2] The silicon carbide semiconductor device may further include a second layer provided on the first layer, and a third layer provided on the second layer, wherein the second insulating layer is provided on the third layer, wherein the second layer includes Ni or TiAlSi, and wherein the third layer includes one of Ti, TiN, Ta, and TaN.

[3] In the silicon carbide semiconductor device, the first layer may have a thickness of 33 nm or greater and 120 nm or less, and the third layer may have a thickness of 5 nm or greater and 30 nm or less.

[4] In the silicon carbide semiconductor device, the first layer may include one of Ti, TiN, and a laminated layer of Ti and TiN, the second layer may include Ni, and the third layer may include one of Ti, TiN, and a laminated layer of Ti and TiN.

[5] The silicon carbide semiconductor device may further include a third layer provided on the first layer, wherein the second insulating layer is provided on the third layer, and wherein the third layer includes one of Ti, TiN, Ta, and TaN.

[6] The silicon carbide semiconductor device may further include a source electrode, including an alloy layer of Ni and Si, and provided on the first surface of the silicon carbide substrate.

[7] The silicon carbide semiconductor device may further include a gate trench provided on the first surface of the silicon carbide substrate, wherein the gate insulating layer is provided on an inner wall of the gate trench, and wherein the gate electrode is provided on the gate insulating layer at the gate trench.

[8] The silicon carbide semiconductor device may further include a drain electrode provided on a second surface of the silicon carbide substrate, opposite to the first surface provided with the gate electrode.

DETAILS OF EMBODIMENTS OF PRESENT DISCLOSURE

Next, the embodiments of the present disclosure will be described, however, the present disclosure is not limited to the described embodiments.

First Embodiment

First, the reason why the gate threshold value varies in the so-called vertical transistor, which is an example of the silicon carbide semiconductor device, will be described. When the semiconductor device is used at a high temperature, the gate threshold voltage may decrease, and it is regarded that this decrease in the gate threshold voltage is caused by entry of sodium (Na) from the outside into the semiconductor device. Hence, it is conceivable to provide a protection layer that becomes a barrier layer for preventing the entry of Na from the outside. FIG. 1 is a structure diagram illustrating the silicon carbide semiconductor device, that is, the vertical transistor, having such a structure including the protection layer.

The vertical transistor illustrated in FIG. 1 includes a first n-type layer 21, a p-type layer 22, and a second n-type layer 23 that are successively formed on a first primary surface 10a of a silicon carbide single-crystal (or monocrystal) substrate 10. In addition, a gate trench having a V-shaped cross section is formed by removing portions of the second n-type layer 23, the p-type layer 22, and the first n-type layer 21. In this state, the second n-type layer 23, the p-type layer 22, and the first n-type layer 21 are partially exposed at a sidewall of the gate trench. Further, a bottom surface and the sidewall of the gate trench are covered by a gate insulating layer 30. The inside of the gate trench is filled by polysilicon deposited on the gate insulating layer 30, to form a gate electrode 41.

A heavily-doped p-type region 24 having a high impurity concentration is formed in a region located between two gate trenches and separated from the two gate trenches, by ion implantation of an impurity element that becomes the p-type. A source electrode 42 is formed on portions of the second n-type layer 23 and the heavily-doped p-type region 24. The source electrode 42 is formed by depositing a nickel (Ni) layer and performing a heat treatment. During this heat treatment, a reaction occurs between silicon (Si) included in the second n-type layer 23 that is made of a silicon carbide semiconductor and the heavily-doped p-type region 24, and Ni included in the Ni layer, to form an alloy layer of Ni and Si, and enable a contact resistance to be reduced. In addition, a drain electrode 43 is formed on a second primary surface 10b of the silicon carbide single-crystal substrate 10, opposite to the first primary surface 10a of the silicon carbide single-crystal substrate 10.

A first insulating layer 50, that becomes the interlayer insulator, is formed to cover the gate electrode 41. A second insulating layer 70 is formed to cover the first insulating layer 50. A source interconnect 80 that becomes an interconnect layer is formed on the source electrode 42 and the second insulating layer 70. For example, the gate electrode 41 is made of polysilicon, the first insulating layer 50 is made of silicon oxide, and the source interconnect 80 is made of aluminum (Al), copper (Cu), alloys including Al or Cu, or the like.

The first n-type layer 21 forms an n-type drift layer, and is relatively lightly-doped with an impurity element that becomes the n-type. The p-type layer 22 forms a p-type body layer, and is doped with an impurity element that becomes the p-type. The second n-type layer 23 is formed by an n-type layer that is more heavily doped with the impurity element that becomes the n-type, when compared to the first n-type layer 21.

When a predetermined voltage is applied to the gate electrode 41 of the vertical transistor having the structure illustrated in FIG. 1, a channel is formed in a region of the p-type layer 22 near the gate insulating layer 30, and there is conduction between the first n-type layer 21 and the second n-type layer 23. Hence, a current flows between the source electrode 42 and the drain electrode 43, to turn on the vertical transistor. When the predetermined voltage is not applied to the gate electrode 41, the channel is not formed in the p-type layer 22, and no current flows between the source electrode 42 and the drain electrode 43, to turn off the vertical transistor.

In the vertical transistor having the structure illustrated in FIG. 1, the second insulating layer 70 may be made of a nitride such as SiN or the like, for example, to prevent the entry of Na from the outside. The nitride such as SiN or the like is dense, and the nitride will not allow atoms of Na or the like to pass through the nitride. As a result, the entry of Na into the silicon carbide semiconductor layer can be prevented, and the decrease in the gate threshold voltage during use of the vertical transistor at high temperatures can be reduced. However, nitrogen included in the SiN or the like forming the second insulating layer 70 may enter near an interface between the gate electrode 41 and the gate insulating layer 30 during the manufacturing process of the vertical transistor (silicon carbide semiconductor device), to decrease the gate threshold voltage during use of the vertical transistor at room temperature.

For this reason, there are demands for a vertical transistor, that is, a silicon carbide semiconductor device, having a structure that not only prevents entry of Na but also prevents entry of nitrogen.

[Silicon Carbide Semiconductor Device]

Figure 2:
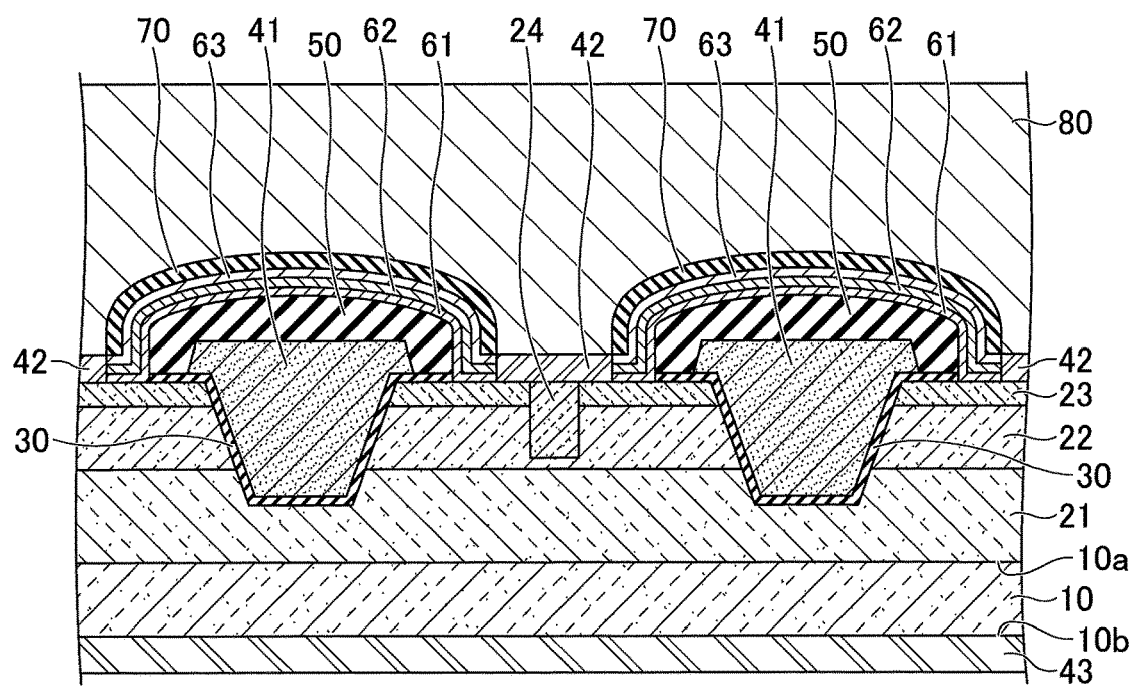
FIG. 2 is a structure diagram illustrating a silicon carbide semiconductor device according to a first embodiment of the present disclosure.

Next, a silicon carbide semiconductor device, that is, a vertical transistor, according to a first embodiment, will be described. As illustrated in FIG. 2, the vertical transistor according to the first embodiment includes a first layer 61 covering the first insulating layer 50 that becomes the interlayer insulator, a second layer 62 covering the first layer 61, and a third layer 63 covering the second layer 62. The second insulating layer 70 is formed to cover the third insulating layer 63. The source interconnect 80 is formed on the source electrode 42 and the second insulating layer 70.

The first layer 61 is made of Ti, TiN, a laminated layer of Ti and TiN, Ta, TaN, a laminated layer of Ta and TaN, or the like. The second layer 62 is made of Ni, TiAlSi, or the like. The third layer 63 is made of Ti, TiN, a laminated layer of Ti and TiN, Ta, TaN, a laminated layer of Ta and TaN, or the like.

Ti, TiN, the laminated layer of Ti and TiN, Ta, TaN, and the laminated layer of Ta and TaN do not allow nitrogen to pass through, and function as a barrier with respect to nitrogen. For this reason, even when the second insulating layer 70 that is formed to cover the third layer 63 is made of SiN or the like, the nitrogen component included in the SiN or the like forming the second insulating layer 70 is prevented from entering into the first layer 61 and the third layer 63. Hence, it is possible to reduce the nitrogen component entering near the gate electrode 41, and reduce the decrease in the gate threshold voltage during the manufacturing process of the silicon carbide semiconductor device.

[Method of Manufacturing Silicon Carbide Semiconductor Device]

Next, a method of manufacturing the silicon carbide semiconductor device according to this embodiment will be described, by referring to FIG. 3 through FIG. 11.

Figure 3:
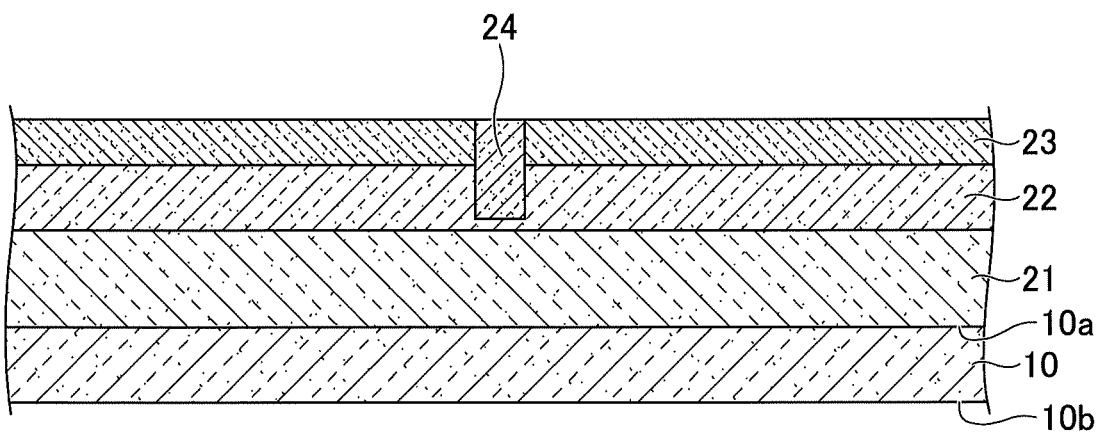
FIG. 3 is a process diagram for explaining a method of manufacturing the silicon carbide semiconductor device according to the first embodiment of the present disclosure.

First, as illustrated in FIG. 3, Al ions are implanted from a surface of a silicon carbide epitaxial layer that is formed on the first primary surface 10a of the silicon carbide single-crystal substrate 10. Hence, the second n-type layer 23 is formed by forming the p-type layer 22, and implanting phosphorus (P) ions into a shallow region at the surface. Further, the heavily-doped p-type region 24 is formed by ion implantation of Al which is the impurity element that becomes the p-type, into portions of the second n-type layer 23 and the p-type layer 22.

In other words, the second n-type layer 23 is formed in a region having a predetermined depth from the surface of the silicon carbide epitaxial layer, by ion implantation of P which is the impurity element that becomes the n-type. In addition, the p-type layer 22 is formed in a region deeper than the second n-type layer 23, by ion implantation of Al which is the impurity element that becomes the p-type. The silicon carbide epitaxial layer that is formed on the first primary surface 10a of the silicon carbide single-crystal substrate 10 is doped with P which is the impurity element that becomes the n-type, to a concentration of approximately $1 \times 10^{16}$ cm$^{-3}$, for example. Accordingly, in the silicon carbide epitaxial layer, a region excluding the p-type layer 22 and the second n-type layer 23 that are formed by the ion implantation becomes the first n-type layer 21.

Figure 4:
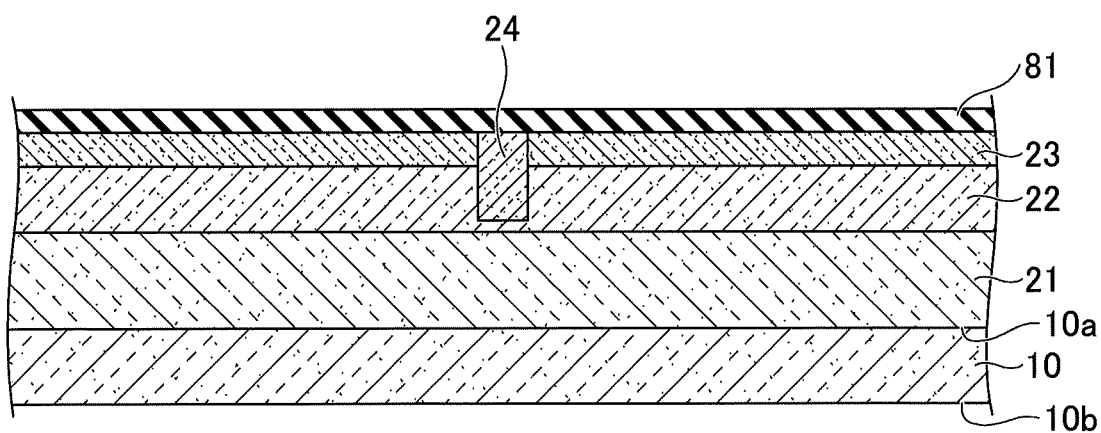
FIG. 4 is a process diagram for explaining the method of manufacturing the silicon carbide semiconductor device according to the first embodiment of the present disclosure.

Next, as illustrated in FIG. 4, a silicon oxide layer 81 is formed on the surface of the silicon carbide epitaxial layer, that is, on surfaces of the second n-type layer 23 and the heavily-doped p-type region 24. More particularly, the silicon oxide layer 81 is formed by thermal oxidation of the surface of the silicon carbide epitaxial layer. The thermal oxidation includes heating to a temperature of 1350° C. within an oxygen atmosphere, and a thickness of the silicon oxide layer 81 that is formed is 50 nm to 80 nm, for example.

Figure 5:
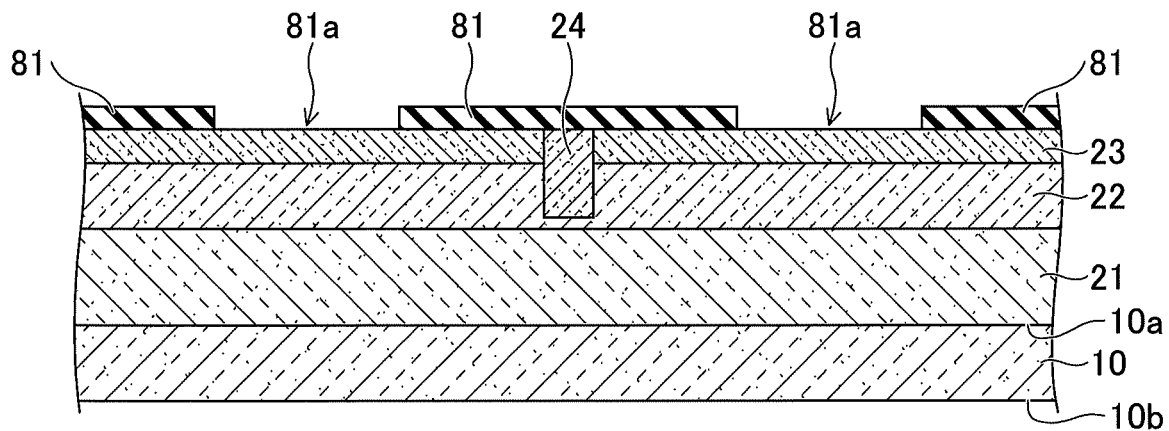
FIG. 5 is a process diagram for explaining the method of manufacturing the silicon carbide semiconductor device according to the first embodiment of the present disclosure.

Next, as illustrated in FIG. 5, openings 81a are formed in the silicon oxide layer 81 in regions where grooves that become the gate trenches are formed. More particularly, a photoresist is coated on the silicon oxide layer 81 by a spin coater or the like, and the photoresist is exposed by an exposure apparatus and developed, to form a resist pattern (not illustrated) having openings in regions where the openings 81a are formed. Thereafter, the silicon oxide layer 81 exposed through the openings in the resist pattern (not illustrated) is removed by Reactive Ion Etching (RIE), to expose the second n-type layer 23 and form the openings 81a. A gas used for the RIE may be a mixed gas of CF$_4$, CHF$_3$, and Ar. Then, the resist pattern (not illustrated) is removed by ashing using oxygen gas, followed by SMP clean and RCA clean.

Figure 6:
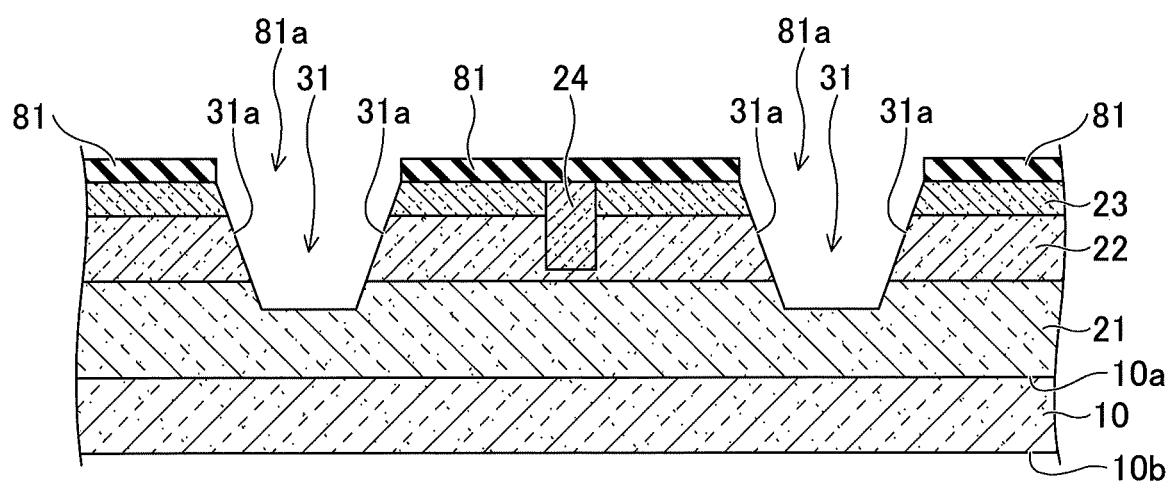
FIG. 6 is a process diagram for explaining the method of manufacturing the silicon carbide semiconductor device according to the first embodiment of the present disclosure.

Next, as illustrated in FIG. 6, gate trenches 31 are formed by removing the silicon carbide epitaxial layer exposed through the openings 81a of the silicon oxide layer 81. By forming the gate trenches 31 in this manner, portions of the second n-type layer 23, the p-type layer 22, and the first n-type layer 21 become exposed at sidewalls 31a of the gate trenches 31. The gate trenches 31 are formed deeper than the p-type layer 22, by thermal etching using chlorine gas, for example. The temperature of the silicon carbide single-crystal substrate 10 during the thermal etching is 800° C. to 900° C., for example.

Figure 7:
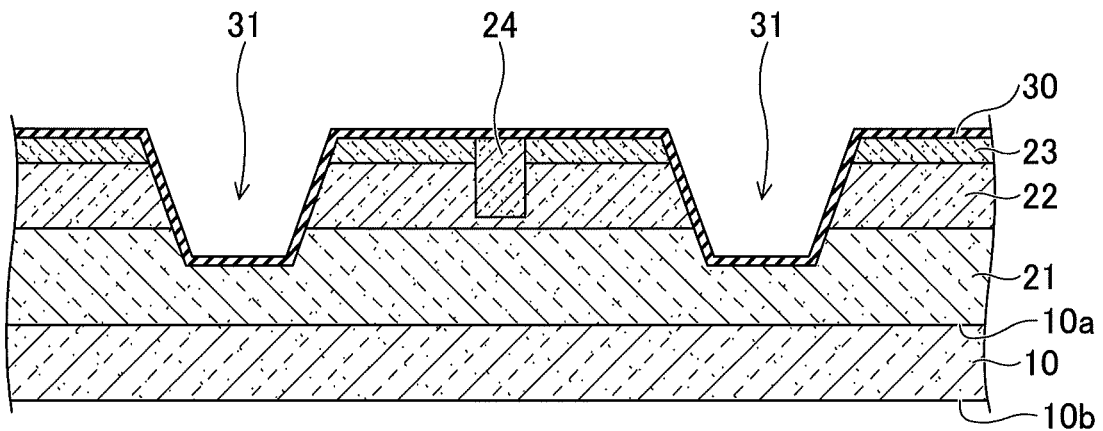
FIG. 7 is a process diagram for explaining the method of manufacturing the silicon carbide semiconductor device according to the first embodiment of the present disclosure.

Next, as illustrated in FIG. 7, after removing the silicon oxide layer 81, the gate insulating layer 30 is formed by oxidizing the surface of the silicon carbide exposed at the gate trenches 31. More particularly, the surface of the silicon carbide exposed at the gate trenches 31 is oxidized, by heating to a temperature of 1100° C. to 1350° C., for example, in a gas including oxygen and nitrogen, to form the gate insulating layer 30.

Figure 8:
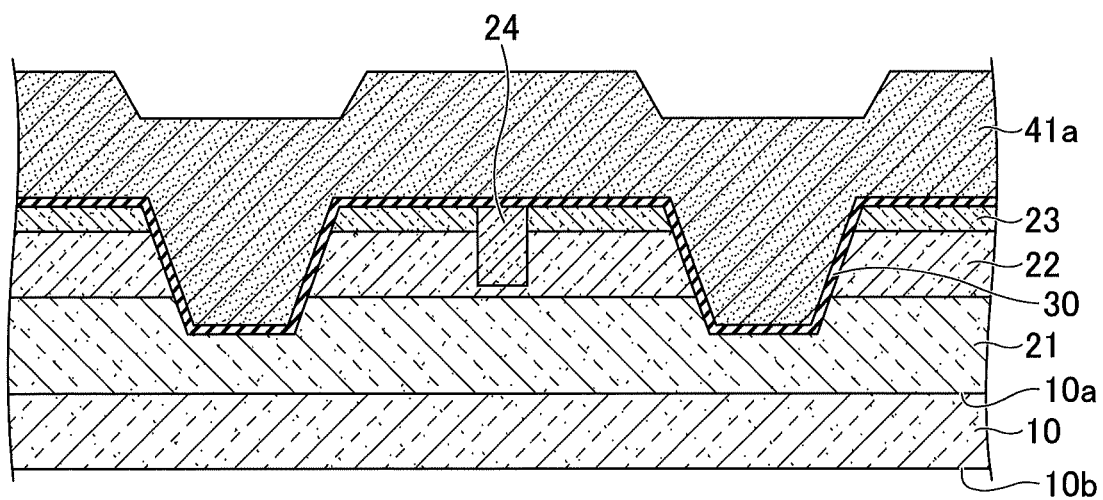
FIG. 8 is a process diagram for explaining the method of manufacturing the silicon carbide semiconductor device according to the first embodiment of the present disclosure.

Next, as illustrated in FIG. 8, the gate trenches 31 are filled by depositing a conductive polysilicon layer 41a doped with an impurity element on the entire surface of the gate insulating layer 30. Hence, the polysilicon layer 41a is formed on the gate insulating layer 30 or the like formed at the gate trenches 31. The polysilicon layer 41a is deposited at a temperature of 550° C. to 600° C., for example, by supplying SiH$_4$, N$_2$, and PH$_3$ into a chamber of a Chemical Vapor Deposition (CVD) apparatus. A thickness of the polysilicon layer 41a that is deposited is 1.0 μm to 1.7 μm, for example.

Figure 9:
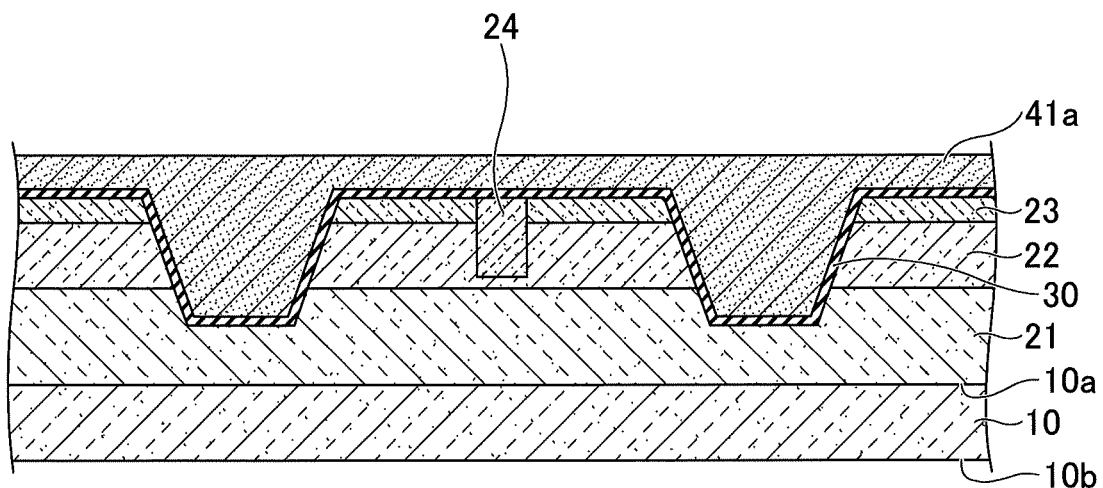
FIG. 9 is a process diagram for explaining the method of manufacturing the silicon carbide semiconductor device according to the first embodiment of the present disclosure.

Next, as illustrated in FIG. 9, a surface of the polysilicon layer 41a is planarized. More particularly, a resist layer (not illustrated) is coated on the entire surface of the polysilicon layer 41a to a thickness of 1 μm to 2 μm, for example, and cured, and the cured resist and the polysilicon layer 41a are thereafter removed by etch-back of RIE. The etch-back of the RIE uses a mixed gas of SF$_6$, C$_4$F$_8$, and Ar, and the etch-back is performed until a thickness of the polysilicon layer 41a on the second n-type layer 23 becomes 250 nm to 550 nm, for example.

Figure 10:
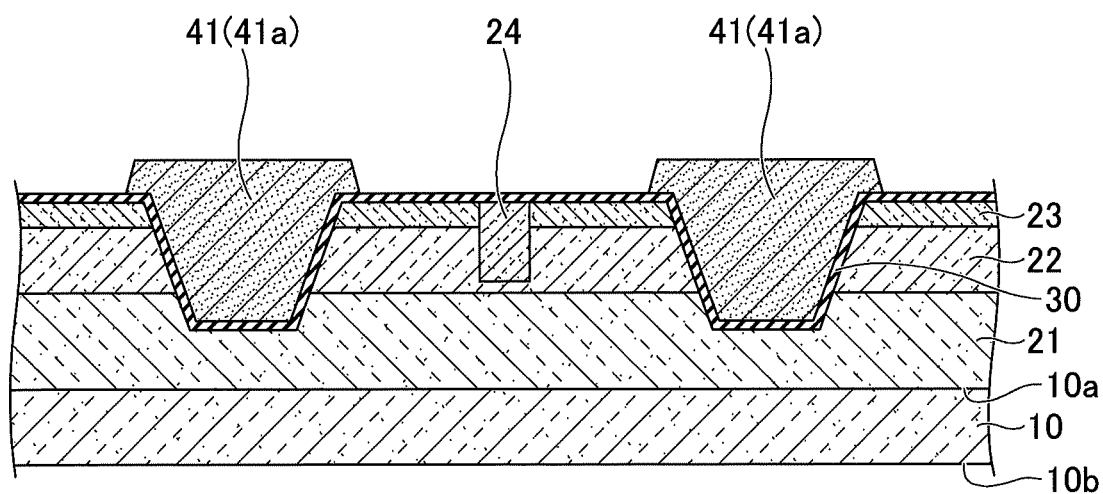
FIG. 10 is a process diagram for explaining the method of manufacturing the silicon carbide semiconductor device according to the first embodiment of the present disclosure.

Next, as illustrated in FIG. 10, the gate electrodes 41 are formed by processing the polysilicon layer 41a. More particularly, a photoresist is coated on the polysilicon layer 41a, and the photoresist is exposed by the exposure apparatus and developed, to form a resist pattern (not illustrated) over regions of the polysilicon layer 41a where the gate electrodes 41 are formed. Thereafter, the polysilicon layer 41a in regions where the resist pattern (not illustrated) is not formed is removed by RIE or the like, to form the gate electrodes 41 by the residual polysilicon layer 41a. Then, the resist pattern (not illustrated) is removed by asking using oxygen gas, followed by SMP clean and RCA clean.

Figure 11:
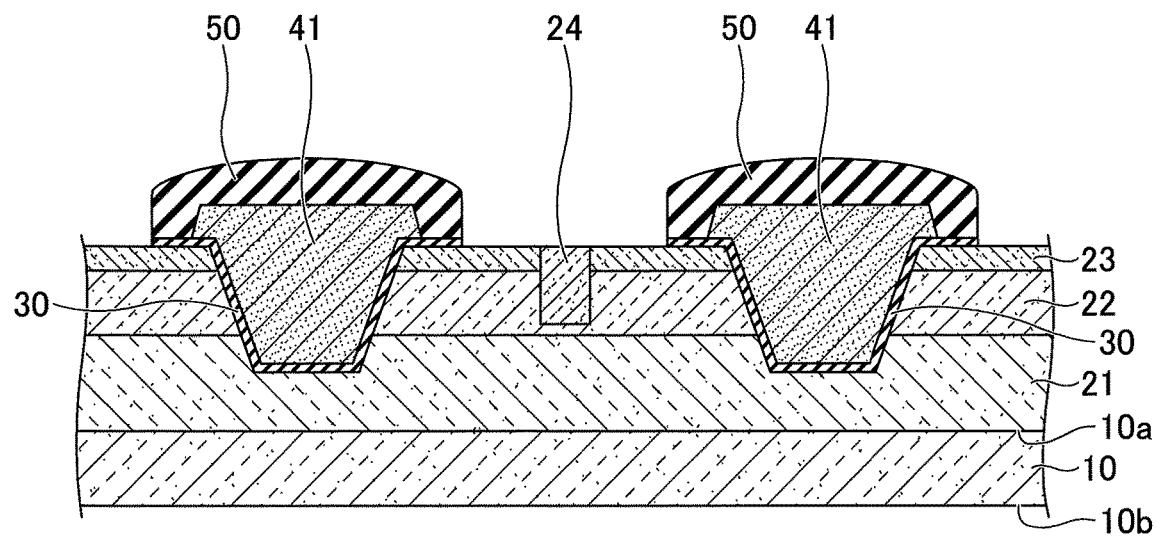
FIG. 11 is a process diagram for explaining the method of manufacturing the silicon carbide semiconductor device according to the first embodiment of the present disclosure.

Next, as illustrated in FIG. 11, the first insulating layer 50 is formed to cover the gate electrodes 41. More particularly, a silicon oxide layer for forming the first insulating layer 50 that becomes the interlayer insulator is deposited to a thickness of 0.5 μm to 1.5 μm, for example, by CVD. Thereafter, a photoresist is coated on the deposited silicon oxide layer, and the photoresist is exposed by the exposure apparatus and developed, to form a resist pattern (not illustrated) over regions of the silicon oxide layer where the first insulating layer 50 is famed. Thereafter, the silicon oxide layer and the gate insulating layer 30 in a region where the resist pattern (not illustrated) is not famed are removed by dry etching of RIE or the like, to expose the second n-type layer 23 and the heavily-doped p-type region 24 in a region where the source electrode 42 is formed. As a result, the first insulating layer 50 covering the gate electrodes 41 is formed by the residual silicon oxide layer. The dry etching uses a mixed gas of CHF$_3$, CF$_4$, and Ar as an etching gas. Then, the resist pattern (not illustrated) is removed by ashing using oxygen gas, followed by SMP clean and RCA clean.

Figure 12:
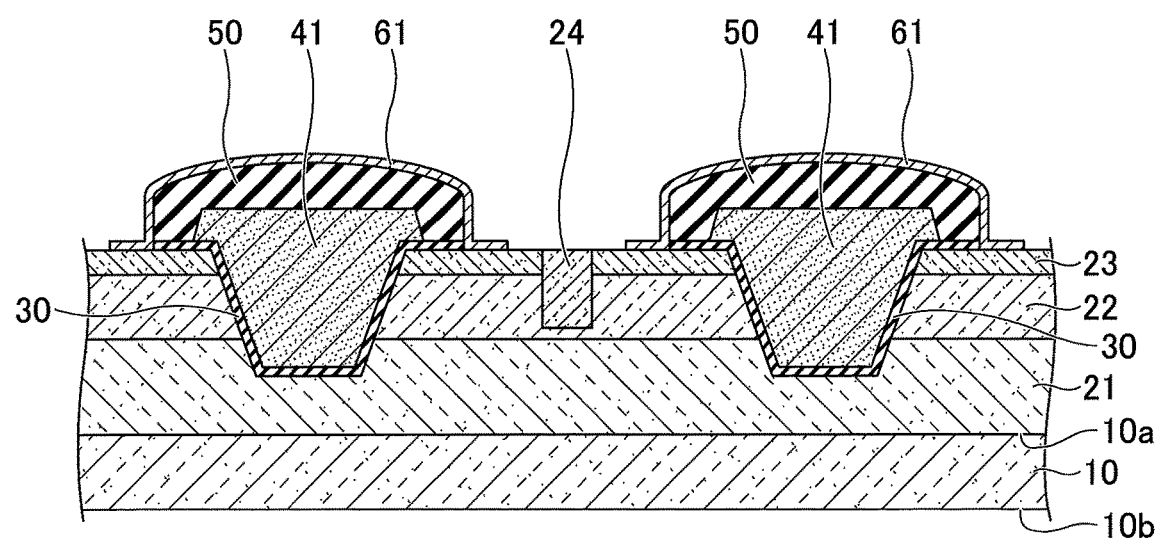
FIG. 12 is a process diagram for explaining the method of manufacturing the silicon carbide semiconductor device according to the first embodiment of the present disclosure.

Next, as illustrated in FIG. 12, the first layer 61 is famed on the first insulating layer 50 and portions of the second n-type layer 23. More particularly, a Ti layer and a TiN layer are successively deposited by sputtering and laminated on the first insulating layer 50 and portions of the second n-type layer 23. The Ti layer is deposited to a thickness of 3 nm or greater and 20 nm or less, for example, and the TIN layer is deposited to a thickness of 30 nm to greater and 100 nm or less, for example. Hence, the first layer 61 is formed to a thickness of 33 nm or greater and 120 nm or less, for example. Thereafter, a photoresist is coated on the TiN layer, and the photoresist is exposed by the exposure apparatus and developed, to form a resist pattern (not illustrated) having an opening in a region where the source electrode 42, which will be described later, is formed. Thereafter, the Ti layer and the TIN layer in regions where the resist pattern (not illustrated) is not formed are removed by dry etching of RIE or the like, to expose portions of the second n-type layer 23 and the heavily-doped p-type region 24. The dry etching uses a mixed gas of $Cl_2$ and $BCl_3$ as an etching gas. Then, the resist pattern (not illustrated) is removed by ashing using oxygen gas.

Figure 13:
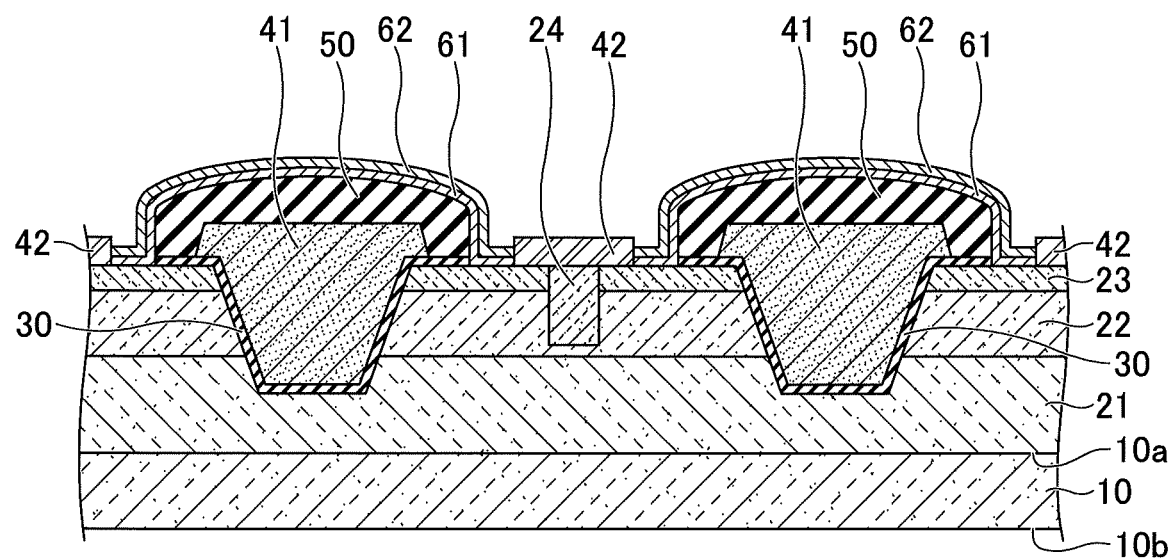
FIG. 13 is a process diagram for explaining the method of manufacturing the silicon carbide semiconductor device according to the first embodiment of the present disclosure.

Next, as illustrated in FIG. 13, the second layer 62 is famed on the first layer 61, and the source electrode 42 is formed on the second n-type layer 23 and the heavily-doped p-type region 24. More particularly, an Ni layer is deposited by sputtering to a thickness of 15 nm or greater and 60 nm or less, for example. Hence, the second layer 62 is formed by the Ni layer deposited on the first layer 61. In addition, the Ni layer is also deposited on the second n-type layer 23 and the heavily-doped p-type region 24, and when a heat treatment is performed on the Ni layer formed in this region in an Ar atmosphere, Ni and Si are alloyed, and the source electrode 42 is formed by the alloyed, NiSi alloy layer, The heat treatment is performed at a temperature of 850° C. to 1000° C., for example.

Figure 14:
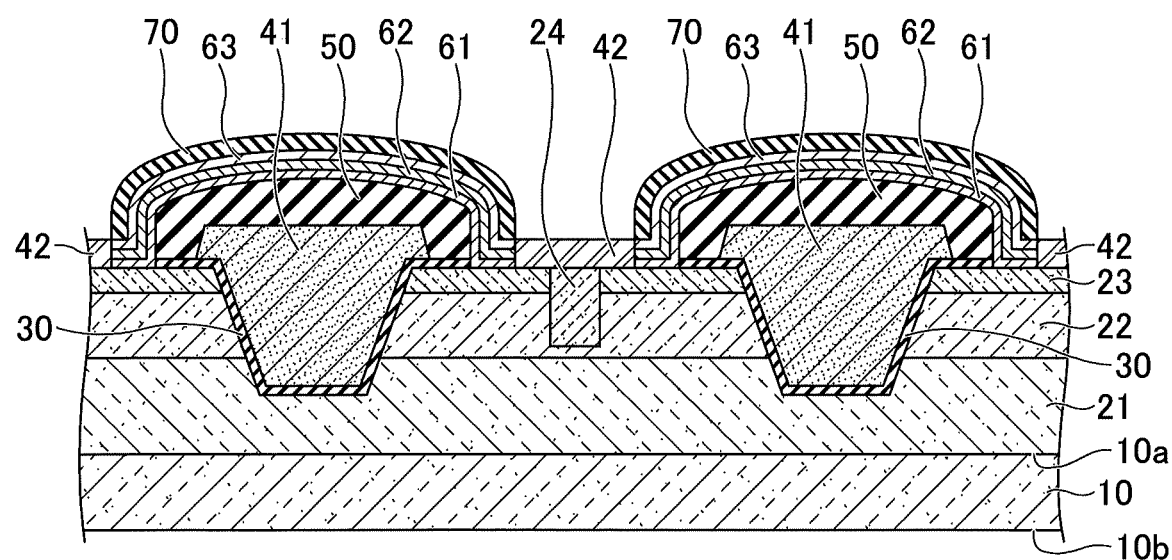
FIG. 14 is a process diagram for explaining the method of manufacturing the silicon carbide semiconductor device according to the first embodiment of the present disclosure.

Next, as illustrated in FIG. 14, the third layer 63 is formed on the second layer 62, and further, the second insulating layer 70 is formed on the third layer 63. More particularly, a Ti layer is deposited on the second layer 62 by sputtering, to form the third layer 63, and a silicon nitride layer is deposited on the third layer 63 by plasma CVD, to form the second insulating layer 70. The Ti layer that is deposited as the third layer 63 has a thickness of 5 nm or greater and 30 nm of less, for example, and the silicon nitride layer that is formed as the second insulating layer 70 has a thickness of 50 nm or greater and 150 nm or less, for example. Thereafter, a photoresist is coated on the second insulating layer 70, and the photoresist is exposed by the exposure apparatus and developed, to form a resist pattern (not illustrated) having an opening over a region where the source electrode 42 is formed. Then, the second insulating layer 70 and the third layer 63 in regions where the resist pattern (not illustrated) is not formed are removed by dry etching of RIE or the like, to expose the source electrode 42. The dry etching of the second insulating layer 70 uses a mixed gas of $CHF_3$ and Ar as an etching gas, and the dry etching of the third layer 63 uses a mixed gas of $Cl_2$ and $BCl_3$ as an etching gas. Thereafter, the resist pattern (not illustrated) is removed by ashing using oxygen gas.

Figure 15:
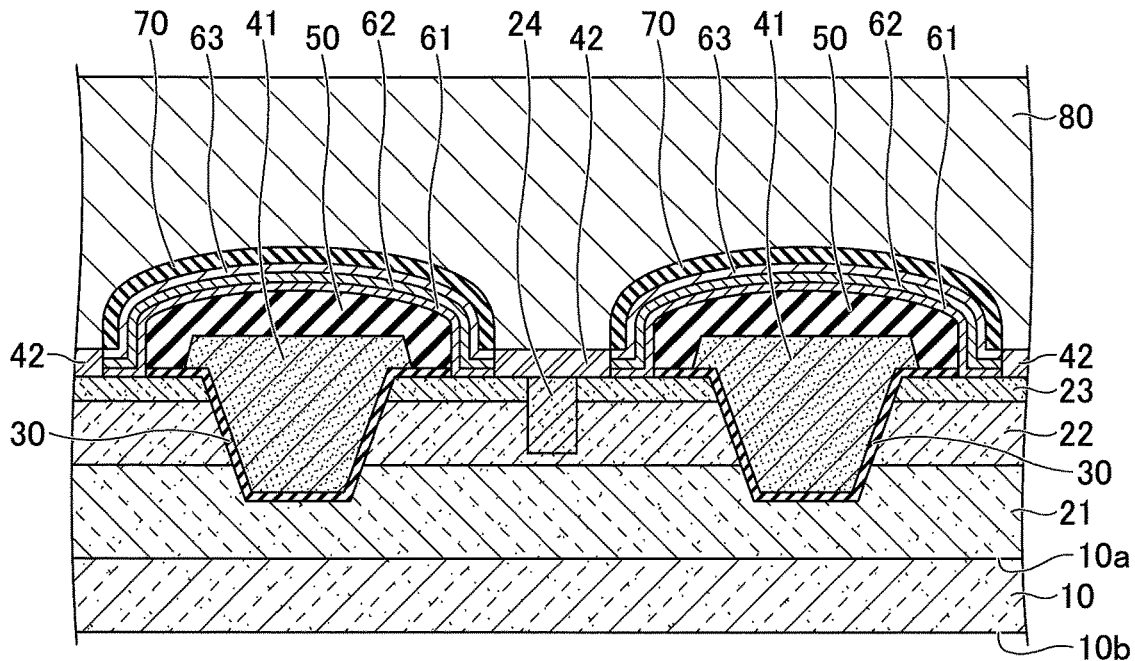
FIG. 15 is a process diagram for explaining the method of manufacturing the silicon carbide semiconductor device according to the first embodiment of the present disclosure.

Next, as illustrated in FIG. 15, AlCu or AlSiCu is deposited by sputtering on the source electrode 42 and the second insulating layer 70, to form the source interconnect 80. The source interconnect 80 that is formed has a thickness of 4 μm to 6 μm, for example.

Figure 16:
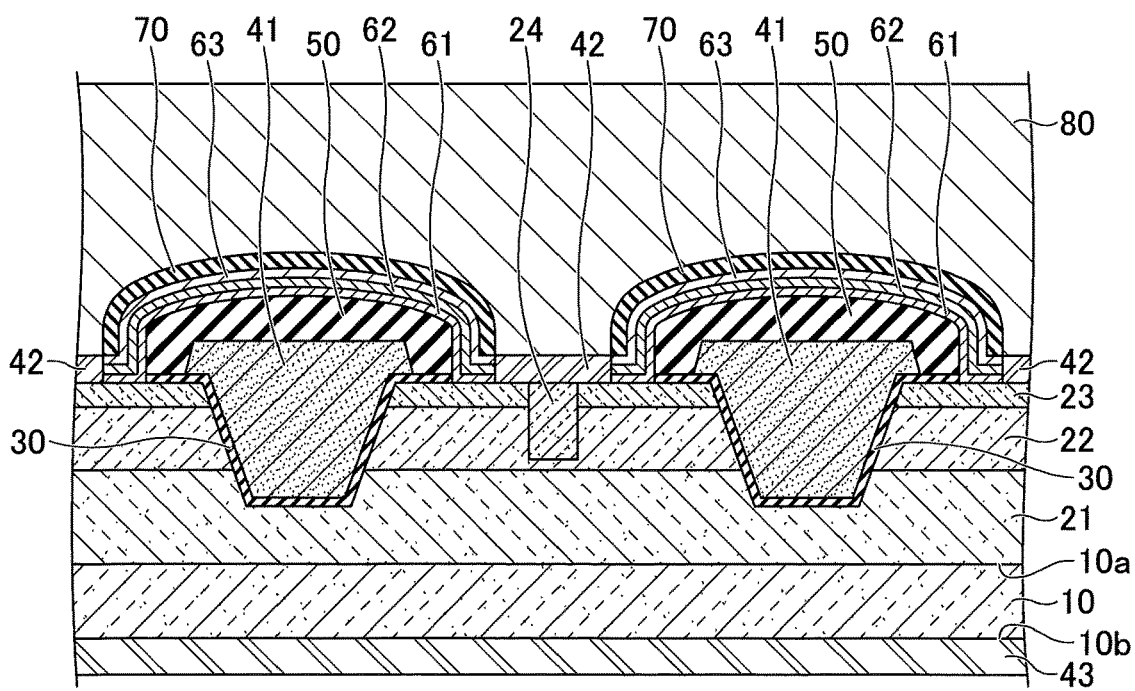
FIG. 16 is a process diagram for explaining the method of manufacturing the silicon carbide semiconductor device according to the first embodiment of the present disclosure.

Next, as illustrated in FIG. 16, a metal layer is deposited on the second primary surface 10b of the silicon carbide single-crystal substrate 10, opposite to the first primary surface 10a, to form the drain electrode 43.

By the processes described above, it is possible to manufacture the silicon carbide semiconductor device according to the first embodiment.

According to this embodiment, it is possible to prevent Na from entering the silicon carbide semiconductor layer from the outside, because the second insulating layer 70 is formed by the silicon nitride layer. In addition, the first layer 61 and the third layer 63 covering the gate electrode 41 is made of Ti, TiN, or the like, and the second insulating layer 70, formed by the silicon nitride layer, is formed on the third layer 63. Hence, the third layer 63 and the first layer 61 function as barriers, to prevent the nitrogen component included in the second insulating layer 70 from entering the silicon carbide semiconductor layer.

Second Embodiment

Figure 17:
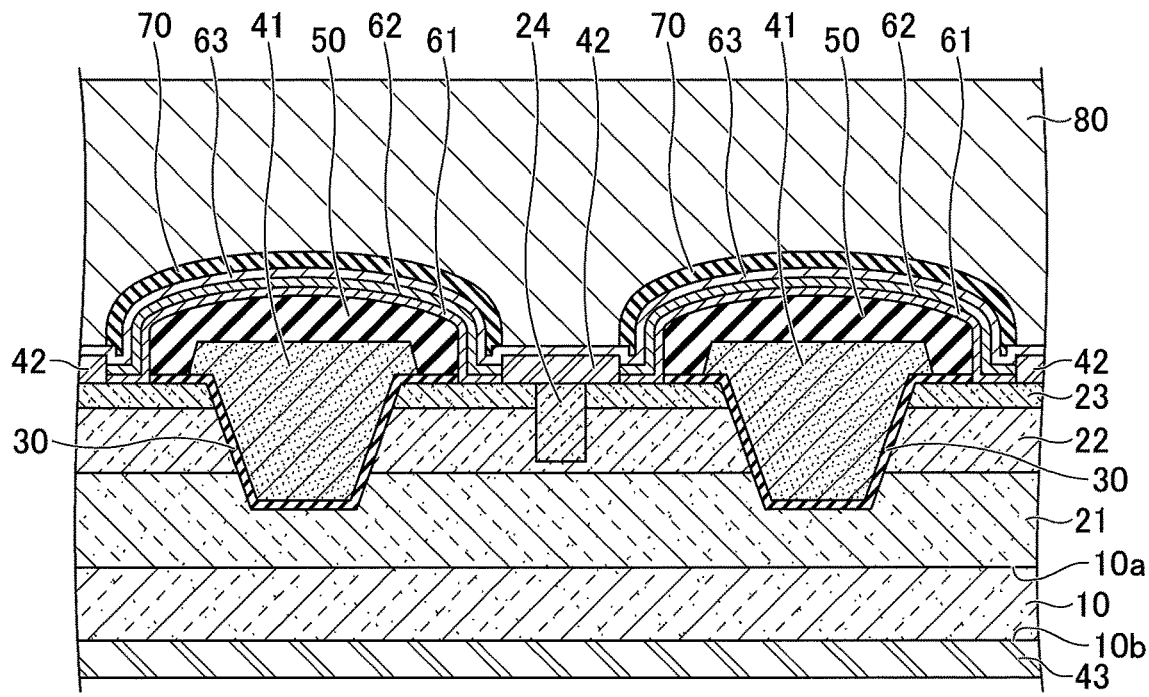
FIG. 17 is a structure diagram illustrating the silicon carbide semiconductor device according to a second embodiment of the present disclosure.

Next, a silicon carbide semiconductor device, that is, a vertical transistor, according to a second embodiment, will be described. As illustrated in FIG. 17, the vertical transistor according to the second embodiment includes the first layer 61 covering the first insulating layer 50 that becomes the interlayer insulator, the second layer 62 covering the first layer 61, and the third layer 63 covering the second layer 62. The second insulating layer 70 is formed to cover the third layer 63. The source interconnect 80 is formed on the source electrode 42 via the third layer 63, and on the second insulating layer 70.

According to this embodiment, the source electrode 42 will not be exposed directly to the plasma, and for this reason, it is possible to reduce the resistance between the source electrode 42 and the source interconnect 80 to a low value.

[Method of Manufacturing Silicon Carbide Semiconductor Device]

Next, a method of manufacturing the silicon carbide semiconductor device according to this embodiment will be described, by referring to FIG. 18 through FIG. 20.

Processes of the method of manufacturing the silicon carbide semiconductor device according to the second embodiment, up to the process of obtaining the structure illustrated in FIG. 13, are the same as the processes of the method of manufacturing the silicon carbide semiconductor device according to the first embodiment described above in conjunction with FIG. 2 through FIG. 13. Accordingly, processes after obtaining the structure illustrated in FIG. 13 will be described for the method of manufacturing the silicon carbide semiconductor device according to the second embodiment.

Figure 18:
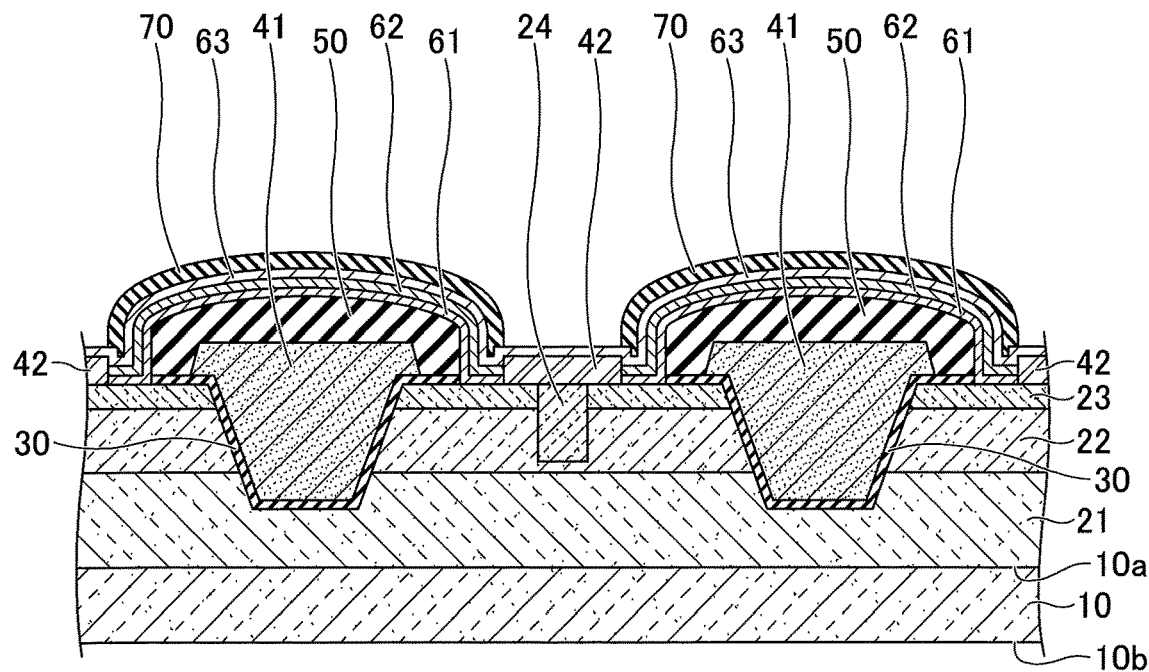
FIG. 18 is a process diagram for explaining the method of manufacturing the silicon carbide semiconductor device according to the second embodiment of the present disclosure.

After the process described above in conjunction with FIG. 13, the third layer 63 is formed on the second layer 62 and the source electrode 42, and further, the second insulating layer 70 is formed on the third layer 63, as illustrated in FIG. 18. Thereafter, a photoresist is coated on the second insulating layer 70, and the photoresist is exposed by the exposure apparatus and developed, to form a resist pattern (not illustrated) having an opening in a region where the source electrode 42 is famed. Then, the second insulating layer 70 in regions where the resist pattern (not illustrated) is not formed are removed by dry etching of RIE or the like, to expose the third layer 63.

The alloy layer forming the source electrode 42 will be damaged if the alloy layer were exposed to the plasma, and in this case, a contact resistance between the damaged source electrode 42 and the source interconnect 80 formed on the damaged source electrode 42 would become large. Hence, in this embodiment, the dry etching is stopped in a state where the third layer 63 becomes exposed, to prevent the plasma damage to the source electrode 42, which would otherwise be caused by the dry etching. Because the third layer 63 is made of a metal material such as Ti or the like, it is possible to secure conduction between the source interconnect 80 and the source electrode 42 via the third layer 63.

Figure 19:
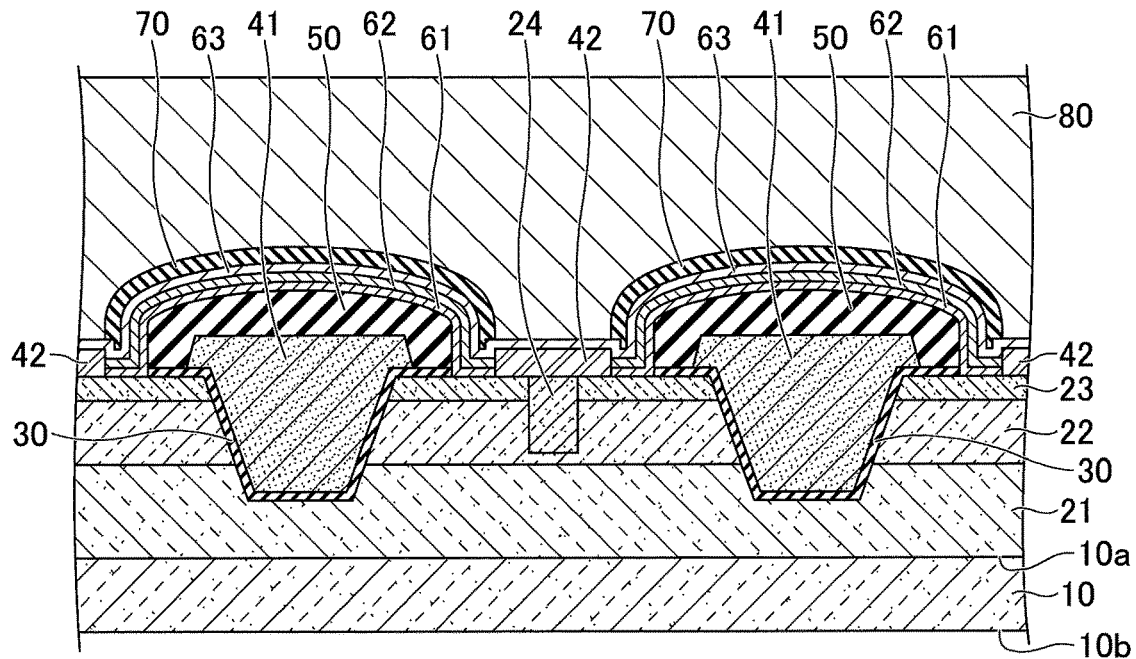
FIG. 19 is a process diagram for explaining the method of manufacturing the silicon carbide semiconductor device according to the second embodiment of the present disclosure.

Next, as illustrated in FIG. 19, AlCu or AlSiCu is deposited by sputtering on the third layer 63 and the second insulating layer 70, to form the source interconnect 80. Hence, the source electrode 42 and the source interconnect 80 are electrically connected via the third layer 63.

Figure 20:
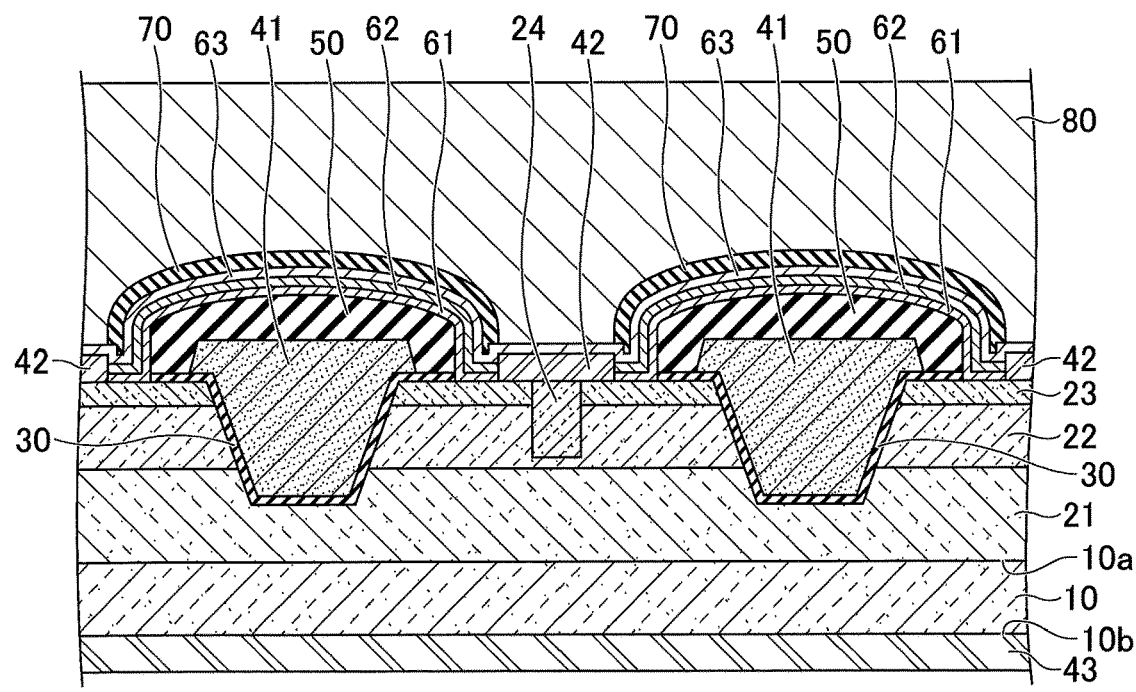
FIG. 20 is a process diagram for explaining the method of manufacturing the silicon carbide semiconductor device according to the second embodiment of the present disclosure.

Next, as illustrated in FIG. 20, a metal layer is deposited on the second primary surface 10b of the silicon carbide single-crystal substrate 10, opposite to the first primary surface 10a, to form the drain electrode 43.

Other than the processes described above in conjunction with FIG. 18 through FIG. 20, the processes of the method of manufacturing the silicon carbide semiconductor device according to the second embodiment are the same as the processes of the method of manufacturing the silicon carbide semiconductor device according to the first embodiment.

By the processes described above, it is possible to manufacture the silicon carbide semiconductor device according to the second embodiment.

Third Embodiment

Figure 21:
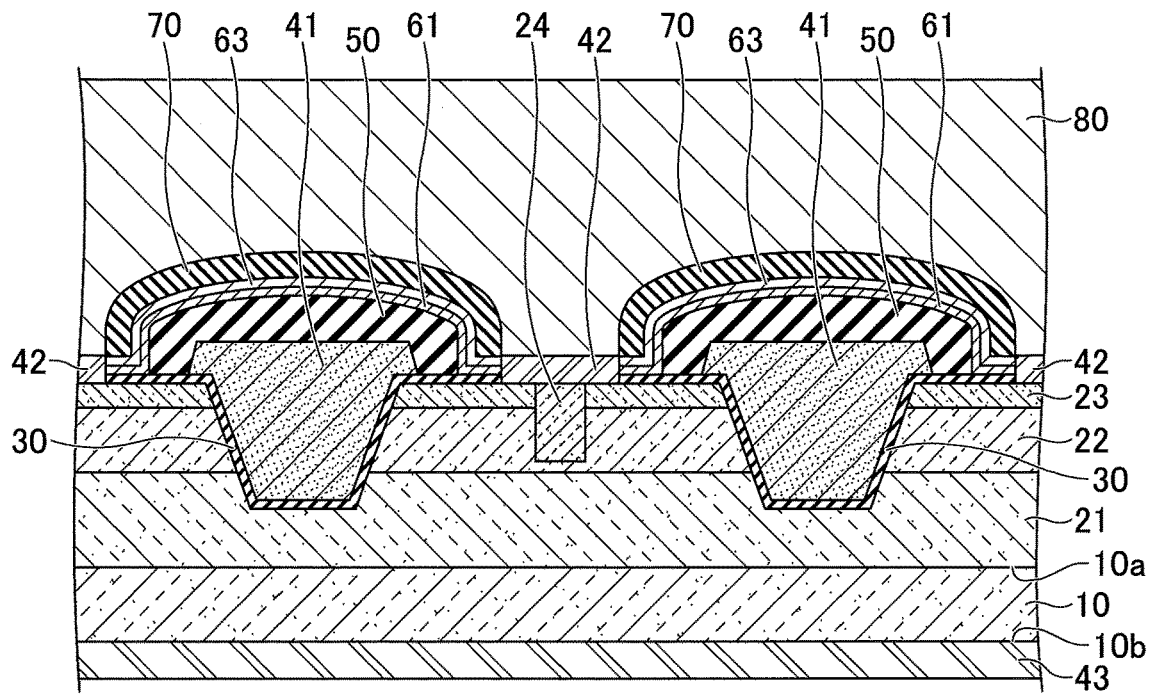
FIG. 21 is a structure diagram illustrating the silicon carbide semiconductor device according to a third embodiment of the present disclosure.

Next, a silicon carbide semiconductor device, that is, a vertical transistor, according to a third embodiment, will be described. As illustrated in FIG. 21, the vertical transistor according to the third embodiment includes the first layer 61 covering the first insulating layer 50 that becomes the interlayer insulator, and the third layer 63 covering the first layer 61. The second insulating layer 70 is formed to cover the third layer 63. The source interconnect 80 is formed on the second insulating layer 70 and the source electrode 42.

[Method of Manufacturing Silicon Carbide Semiconductor Device]

Next, a method of manufacturing the silicon carbide semiconductor device according to this embodiment will be described, by referring to FIG. 22 through FIG. 26.

Processes of the method of manufacturing the silicon carbide semiconductor device according to the third embodiment, up to the process of obtaining the structure illustrated in FIG. 12, are the same as the processes of the method of manufacturing the silicon carbide semiconductor device according to the first embodiment described above in conjunction with FIG. 2 through FIG. 12. Accordingly, processes after obtaining the structure illustrated in FIG. 12 will be described for the method of manufacturing the silicon carbide semiconductor device according to the third embodiment.

Figure 22:
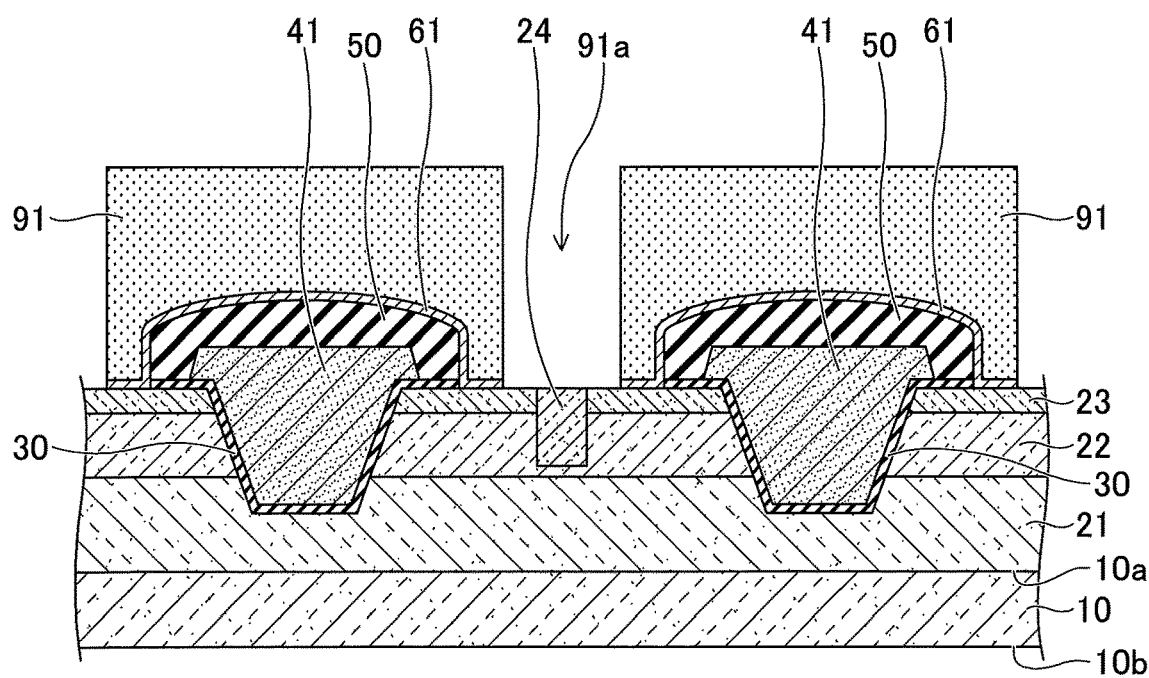
FIG. 22 is a process diagram for explaining the method of manufacturing the silicon carbide semiconductor device according to the third embodiment of the present disclosure.

After the process described above in conjunction with FIG. 12, a resist pattern 91 is formed on the first layer 61, as illustrated in FIG. 22. More particularly, a photoresist is coated on the second n-type layer 23, the heavily-doped p-type region 24, and the first layer 61, and the photoresist is exposed by the exposure apparatus and developed, to form the resist pattern 91 having an opening 91a in a region where the source electrode 42 is formed.

Figure 23:
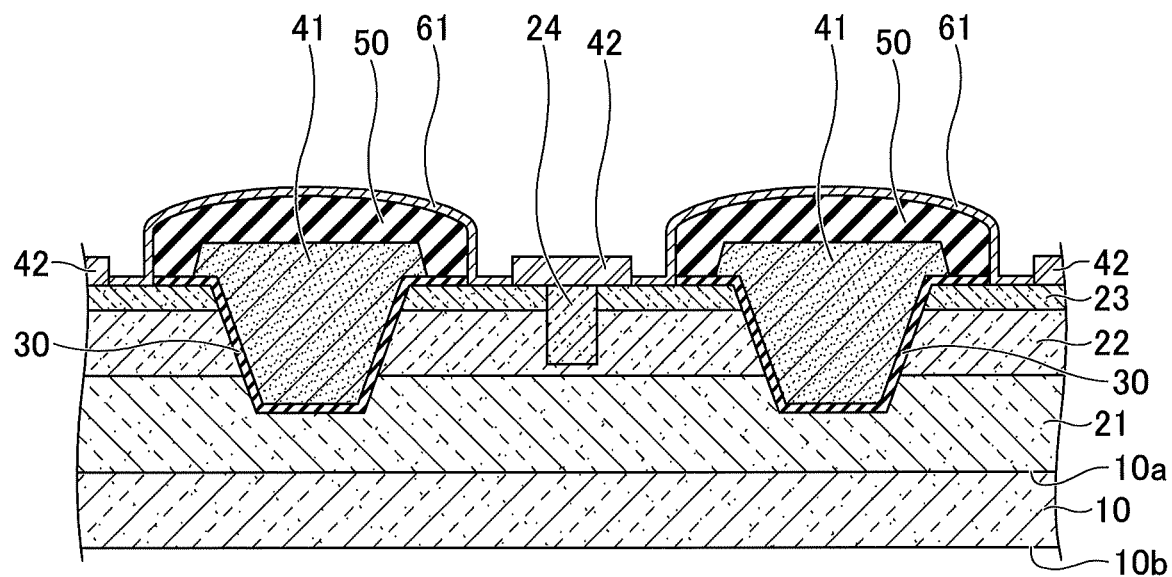
FIG. 23 is a process diagram for explaining the method of manufacturing the silicon carbide semiconductor device according to the third embodiment of the present disclosure.

Next, as illustrated in FIG. 23, the source electrode 42 is formed in the opening 91a of the resist pattern 91. More particularly, a Ni layer is deposited by sputtering on the resist pattern 91, the second n-type layer 23, and the heavily-doped p-type region 24 to a thickness of 30 nm or greater and 100 nm or less, for example, and the resulting structure is thereafter dipped in an organic solvent. Hence, the Ni layer deposited on the resist pattern 91 is removed, together with the resist pattern 91, by lift-off. Then, a heat treatment is performed on the resulting structure in an Ar atmosphere. During this heat treatment, a reaction occurs between Si included in the second n-type layer 23 and the heavily-doped p-type region 24, and Ni included in the Ni layer, to form an alloy layer of Ni and Si. Accordingly, the source electrode 42 is formed on the second n-type layer 23 and the heavily-doped p-type region 24. The heat treatment is performed at a temperature of 850° C. to 1000° C., for example.

Figure 24:
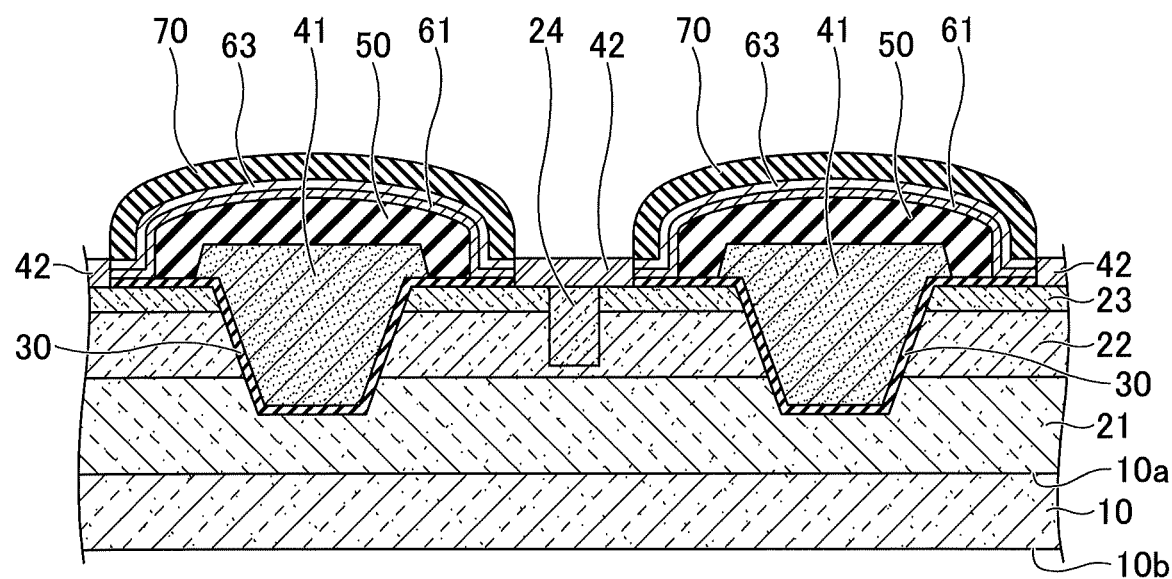
FIG. 24 is a process diagram for explaining the method of manufacturing the silicon carbide semiconductor device according to the third embodiment of the present disclosure.

Next, as illustrated in FIG. 24, the third layer 63 is foisted on the first layer 61, and further, the second insulating layer 70 is formed on the third layer 63. More particularly, a Ti layer is deposited by sputtering on the first layer 61 by sputtering, to form the third layer 63, and a silicon nitride layer is deposited by plasma CVD on the third layer 63, to form the second insulating layer 70. Then, a photoresist is coated on the second insulating layer 70, and the photoresist is exposed by the exposure apparatus and developed, to form a resist pattern (not illustrated) having an opening over a region where the source electrode 42 is formed. Thereafter, the second insulating layer 70 and the third layer 63 in regions where the resist pattern (not illustrated) is not formed are removed by dry etching of RIE or the like, to expose the source electrode 42. Then, the resist pattern (not illustrated) is removed by asking using oxygen gas.

Figure 25:
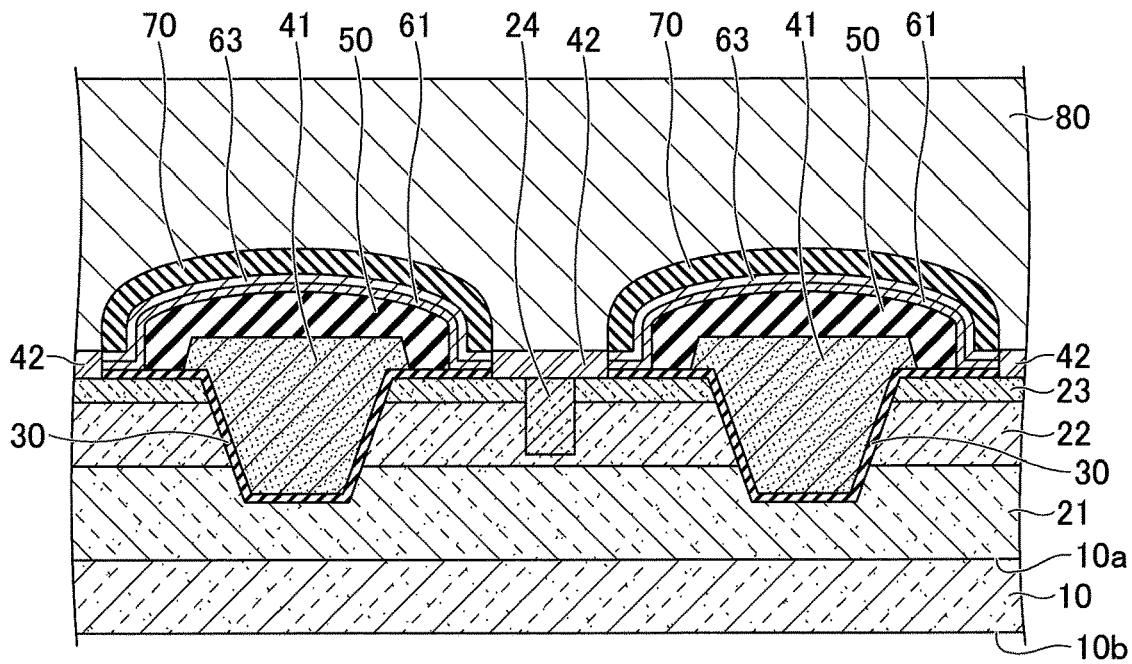
FIG. 25 is a process diagram for explaining the method of manufacturing the silicon carbide semiconductor device according to the third embodiment of the present disclosure.

Next, as illustrated in FIG. 25, AlCu or AlSiCu is deposited by sputtering on the source electrode 42 and the second insulating layer 70, to form the source interconnect 80. The source interconnect 80 is formed to a thickness of 4 µm to 6 µm, for example.

Figure 26:
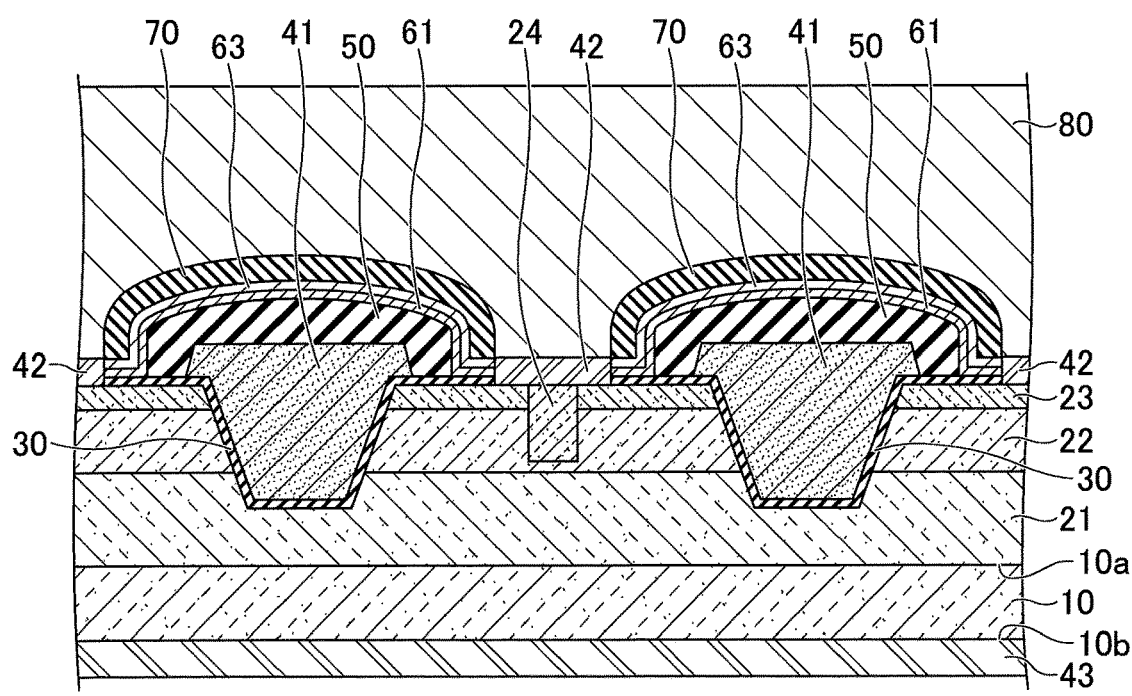
FIG. 26 is a process diagram for explaining the method of manufacturing the silicon carbide semiconductor device according to the third embodiment of the present disclosure.

Next, as illustrated in FIG. 26, a metal layer is deposited on the second primary surface 10b of the silicon carbide single-crystal substrate 10, opposite to the first primary surface 10a, to form the drain electrode 43.

Figure 27:
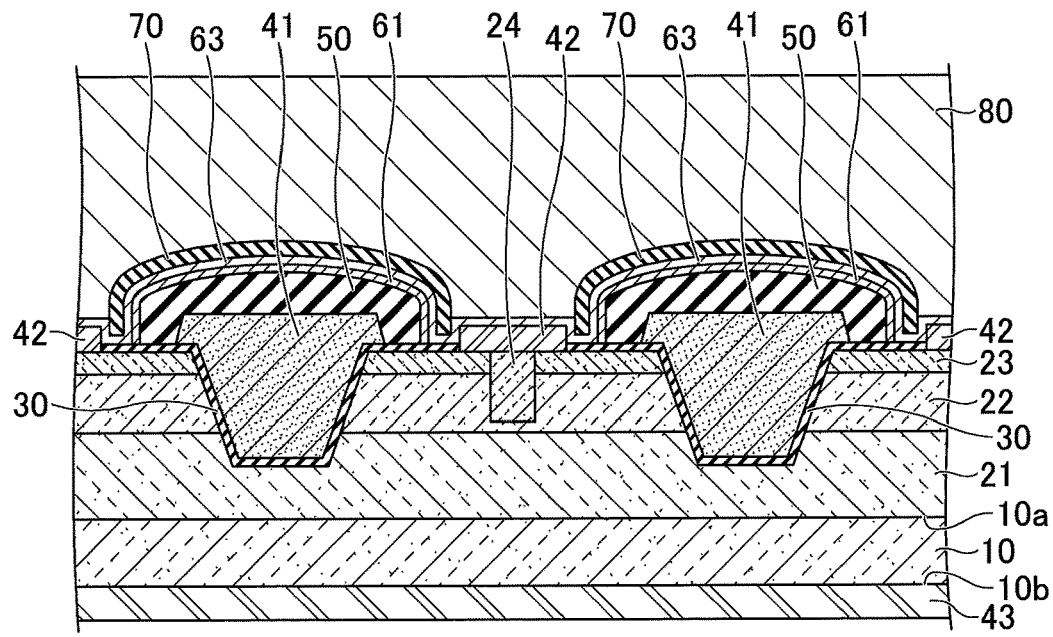
FIG. 27 is a process diagram for explaining the method of manufacturing the silicon carbide semiconductor device according to the third embodiment of the present disclosure.

Other than the processes described above in conjunction with FIG. 22 through FIG. 26, the processes of the method of manufacturing the silicon carbide semiconductor device according to the third embodiment are the same as the processes of the method of manufacturing the silicon carbide semiconductor device according to the first embodiment. Further, this embodiment may have a structure in which the third layer 63 is formed on the source electrode 42, and the source interconnect 80 is formed on the third layer 63, as illustrated in FIG. 27. The silicon carbide semiconductor device having such a structure may be manufactured by applying some of the processes of manufacturing the silicon carbide semiconductor device according to the second embodiment.

By the processes described above, it is possible to manufacture the silicon carbide semiconductor device according to the third embodiment.

According to this embodiment, it is possible to prevent Na from entering the silicon carbide semiconductor layer from the outside, because the second insulating layer 70 is famed by the silicon nitride layer. In addition, the first layer 61 and the third layer 63 covering the gate electrodes 41 are made of Ti, TiN, or the like, and the second insulating layer 70, formed by the silicon nitride layer, is formed on the third layer 63. Hence, the third layer 63 and the first layer 61 function as barriers, to prevent the nitrogen component included in the second insulating layer 70 from entering the silicon carbide semiconductor layer.

Fourth Embodiment

Figure 28:
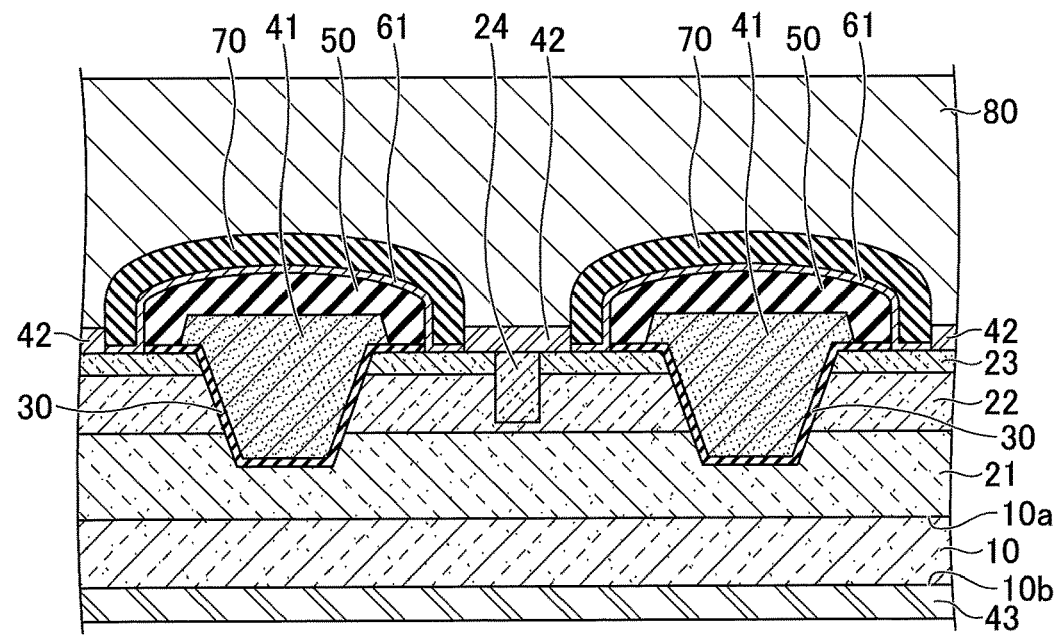
FIG. 28 is a structure diagram illustrating the silicon carbide semiconductor device according to a fourth embodiment of the present disclosure.

Next, a silicon carbide semiconductor device, that is, a vertical transistor, according to a fourth embodiment, will be described. As illustrated in FIG. 28, the vertical transistor according to the fourth embodiment includes the first layer 61 covering the first insulating layer 50 that becomes the interlayer insulator, and the second insulating layer 70 covering the first layer 61. The source interconnect 80 is formed on the second insulating layer 70 and the source electrode 42.

[Method of Manufacturing Silicon Carbide Semiconductor Device]

Next, a method of manufacturing the silicon carbide semiconductor device according to this embodiment will be described, by referring to FIG. 29 through FIG. 33.

Processes of the method of manufacturing the silicon carbide semiconductor device according to the fourth embodiment, up to the process of obtaining the structure illustrated in FIG. 12, are the same as the processes of the method of manufacturing the silicon carbide semiconductor device according to the first embodiment described above in conjunction with FIG. 2 through FIG. 12. Accordingly, processes after obtaining the structure illustrated in FIG. 12 will be described for the method of manufacturing the silicon carbide semiconductor device according to the fourth embodiment.

Figure 29:
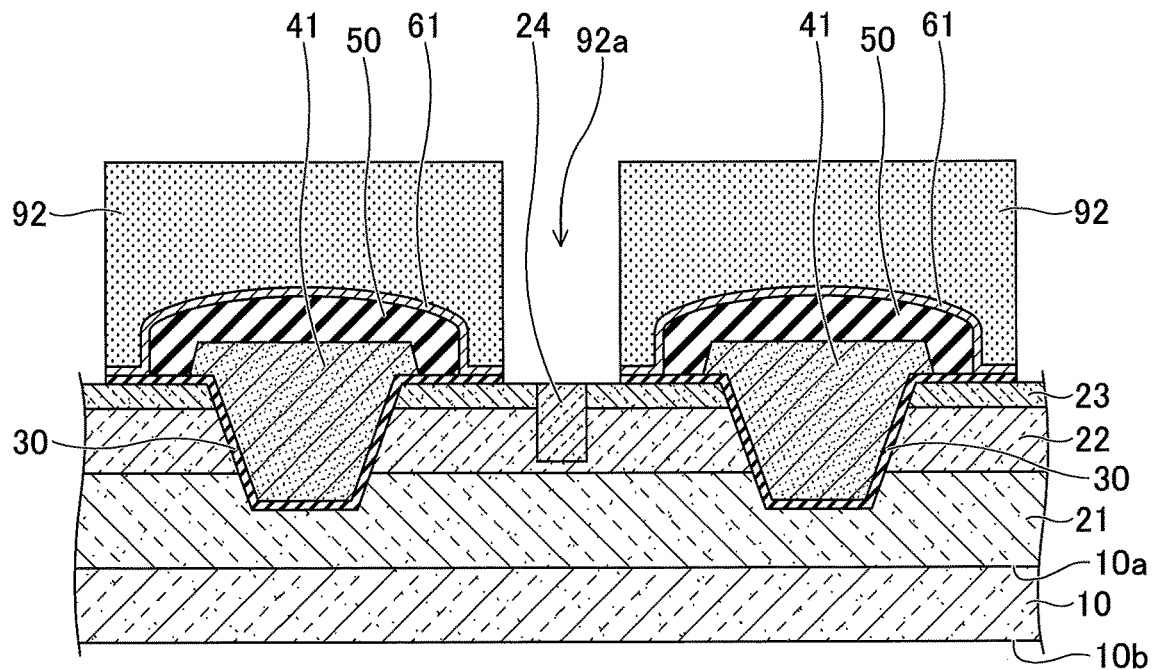
FIG. 29 is a process diagram for explaining the method of manufacturing the silicon carbide semiconductor device according to the fourth embodiment of the present disclosure.

After the process described above in conjunction with FIG. 12, a resist pattern 92 is formed on the first layer 61, as illustrated in FIG. 29. More particularly, a photoresist is coated on the second n-type layer 23, the heavily-doped p-type region 24, and the first layer 61, and the photoresist is exposed by the exposure apparatus and developed, to form the resist pattern 92 having an opening 92a in a region where the source electrode 42 is formed.

Figure 30:
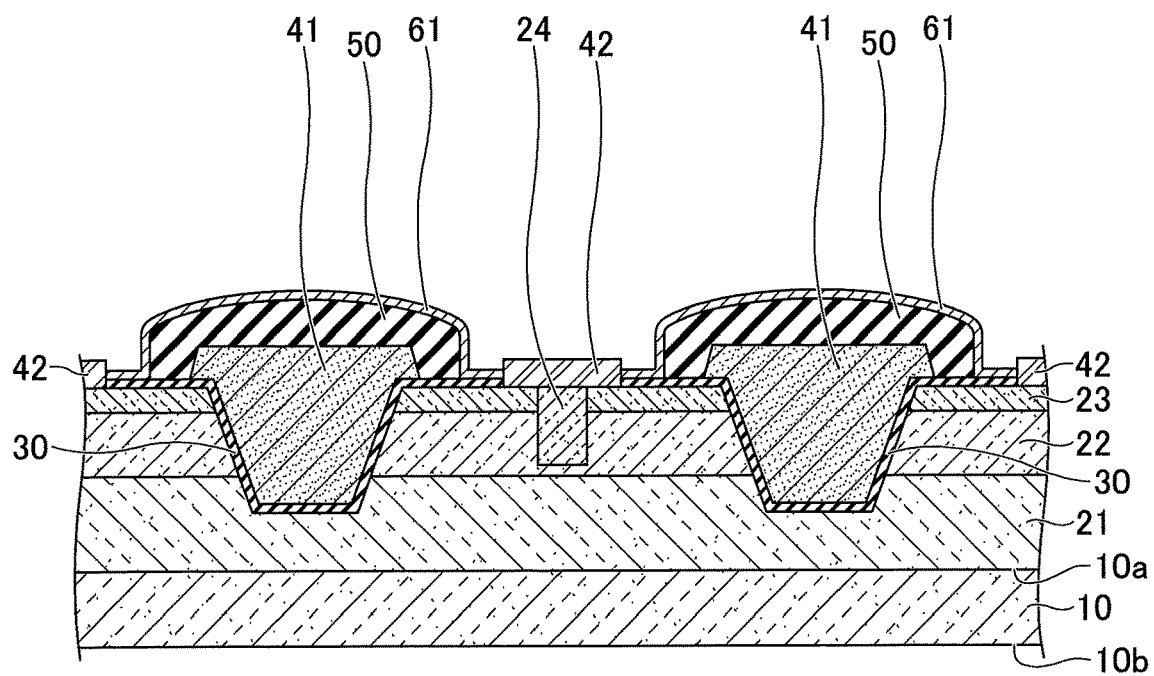
FIG. 30 is a process diagram for explaining the method of manufacturing the silicon carbide semiconductor device according to the fourth embodiment of the present disclosure.

Next, as illustrated in FIG. 30, the source electrode 42 is formed in the opening 92a of the resist pattern 92. More particularly, a Ni layer is deposited by sputtering on the resist pattern 92, the second n-type layer 23, and the heavily-doped p-type region 24 to a thickness of 30 nm or greater and 100 nm or less, for example, and the resulting structure is thereafter dipped in an organic solvent. Hence, the Ni layer deposited on the resist pattern 92 is removed, together with the resist pattern 92, by lift-off. Then, a heat treatment is performed on the resulting structure in an Ar atmosphere. During this heat treatment, a reaction occurs between Si included in the second n-type layer 23 and the heavily-doped p-type region 24, and Ni included in the Ni layer, to form an alloy layer of Ni and Si. Accordingly, the source electrode 42 is formed on the second n-type layer 23 and the heavily-doped p-type region 24. The heat treatment is performed at a temperature of 850° C. to 1000° C., for example.

Figure 31:
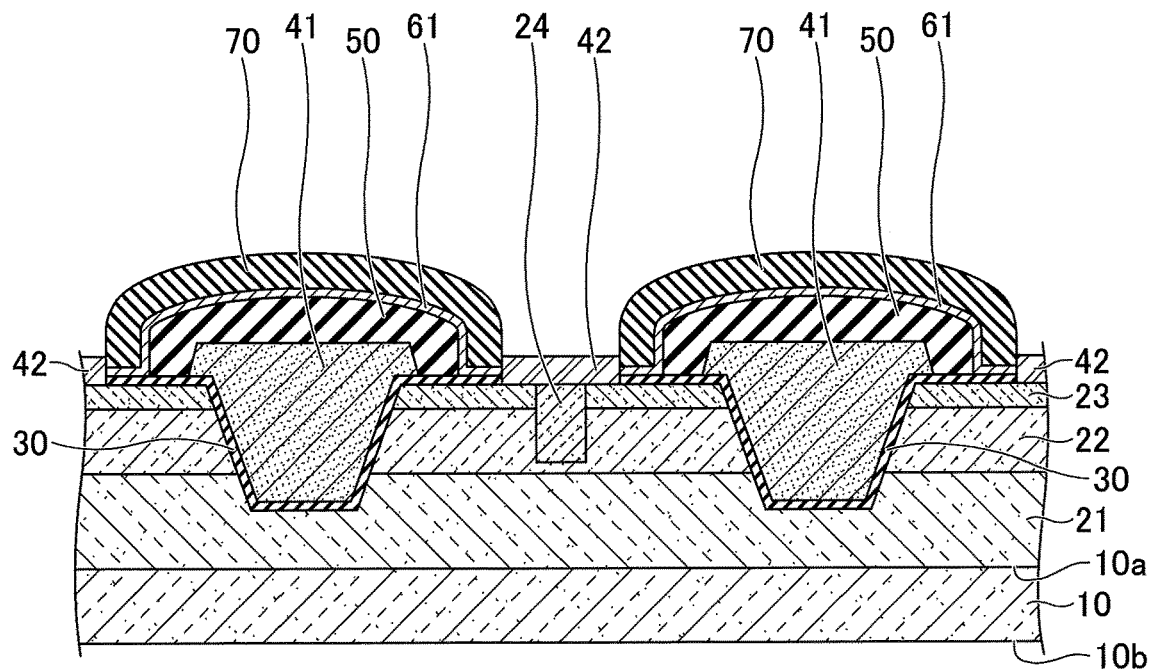
FIG. 31 is a process diagram for explaining the method of manufacturing the silicon carbide semiconductor device according to the fourth embodiment of the present disclosure.

Next, as illustrated in FIG. 31, the second insulating layer 70 is formed on the first layer 61. More particularly, a silicon nitride layer is deposited by plasma CVD on the first layer 61, to form the second insulating layer 70. Then, a photoresist is coated on the second insulating layer 70, and the photoresist is exposed by the exposure apparatus and developed, to form a resist pattern (not illustrated) having an opening over a region where the source electrode 42 is formed. Thereafter, the second insulating layer 70 in regions where the resist pattern (not illustrated) is not formed are removed by dry etching of RIE or the like, to expose the source electrode 42. Then, the resist pattern (not illustrated) is removed by ashing using oxygen gas.

Figure 32:
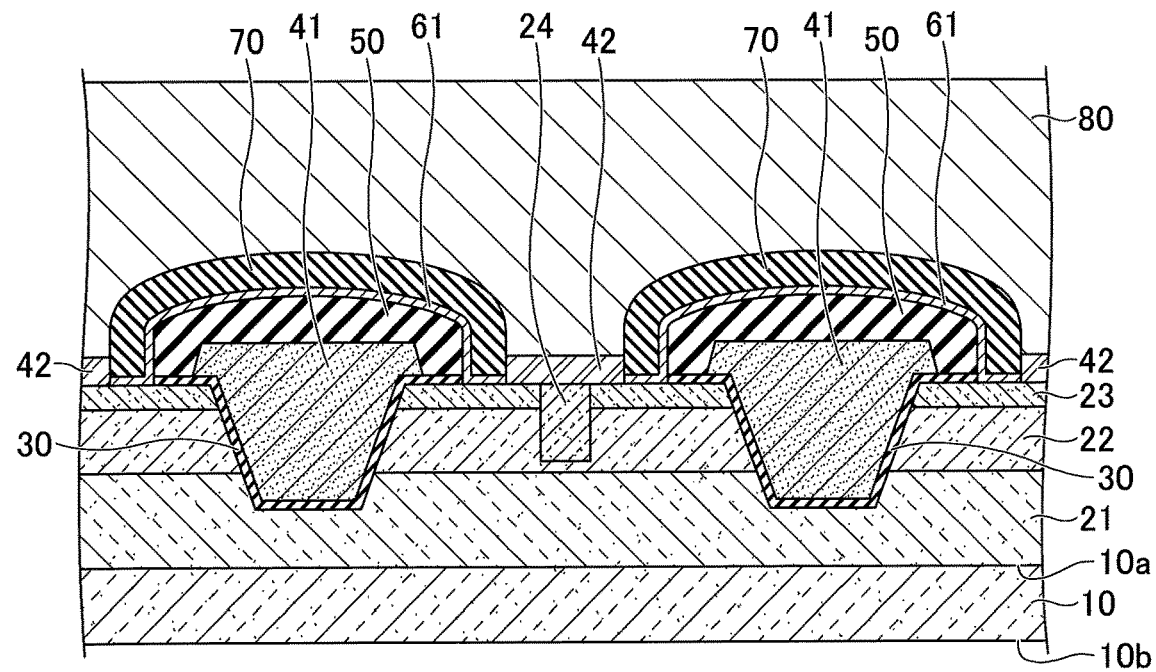
FIG. 32 is a process diagram for explaining the method of manufacturing the silicon carbide semiconductor device according to the fourth embodiment of the present disclosure.

Next, as illustrated in FIG. 32, AlCu or AlSiCu is deposited by sputtering on the source electrode 42 and the second insulating layer 70, to form the source interconnect 80. The source interconnect 80 is formed to a thickness of 4 μm to 6 μm, for example.

Figure 33:
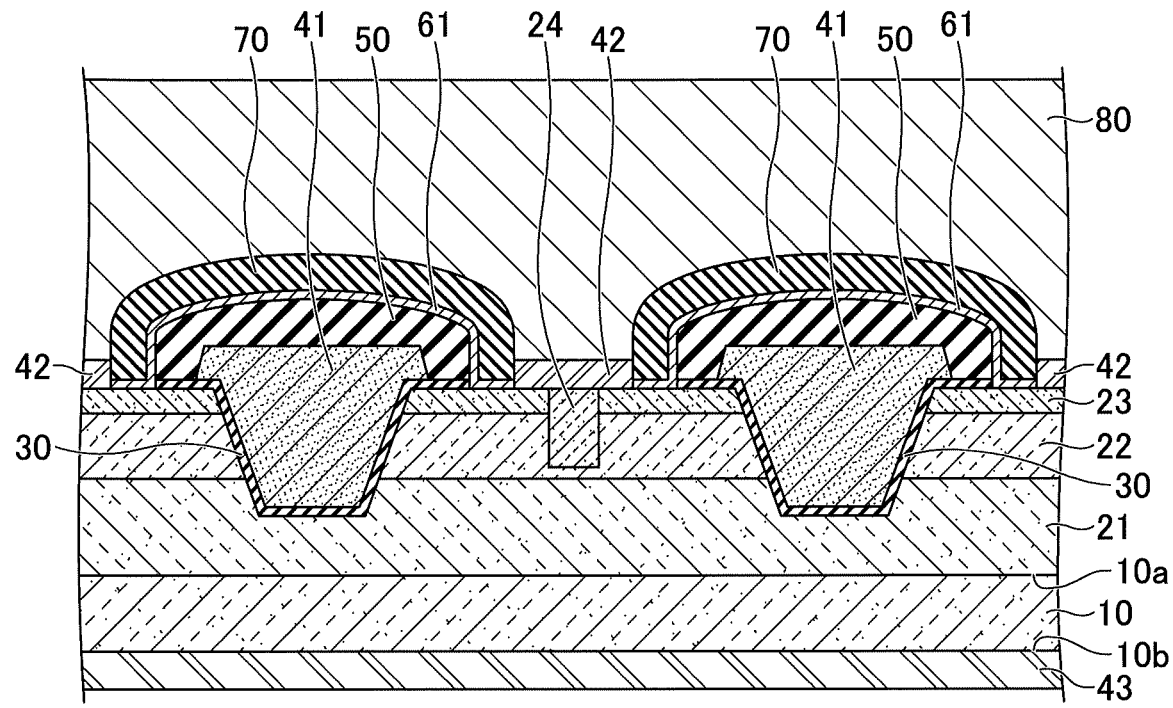
FIG. 33 is a process diagram for explaining the method of manufacturing the silicon carbide semiconductor device according to the fourth embodiment of the present disclosure.

Next, as illustrated in FIG. 33, a metal layer is deposited on the second primary surface 10b of the silicon carbide single-crystal substrate 10, opposite to the first primary surface 10a, to form the drain electrode 43.

Other than the processes described above in conjunction with FIG. 29 through FIG. 33, the processes of the method of manufacturing the silicon carbide semiconductor device according to the fourth embodiment are the same as the processes of the method of manufacturing the silicon carbide semiconductor device according to the first embodiment.

By the processes described above, it is possible to manufacture the silicon carbide semiconductor device according to the fourth embodiment.

Fifth Embodiment

Figure 34:
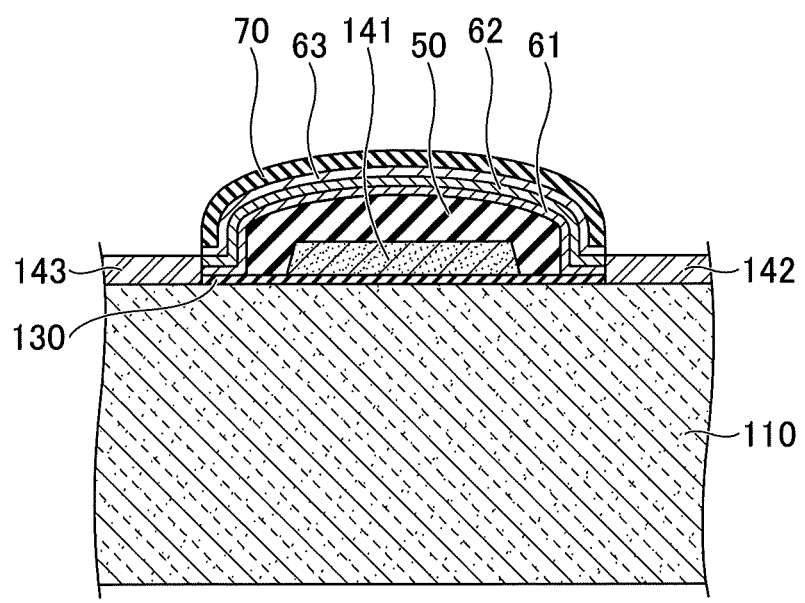
FIG. 34 is a structure diagram illustrating the silicon carbide semiconductor device according to a fifth embodiment of the present disclosure.

Next, a silicon carbide semiconductor device, that is, a vertical transistor, according to a fifth embodiment, will be described. As illustrated in FIG. 34, the vertical transistor according to the fifth embodiment includes a gate insulating layer 130 formed on a surface of a silicon carbide single-crystal substrate 110, and a gate electrode 141 formed on the gate insulating layer 130. In addition, a source electrode 142 and a drain electrode 143 are formed on the surface of the silicon carbide single-crystal substrate 110. The first insulating layer 50 that becomes the interlayer insulator is formed on the gate electrode 141, so as to cover the gate electrode 141. Further, the first layer 61, the second layer 62, and the third layer 63, covering the first insulating layer 50, are laminated on the gate electrode 141. The second insulating layer 70 is formed on the third layer 63.

In the silicon carbide semiconductor device according to this embodiment, a current that flows between the source electrode 142 and the drain electrode 143 can be controlled by applying a voltage to the gate electrode 141. Other than the structure described above in conjunction with FIG. 34, the structure of the silicon carbide semiconductor device according to the fifth embodiment is the same as the structure of the silicon carbide semiconductor device according to the first embodiment.

Hence, according to each of the embodiments described above, it is possible to reduce the variation of the gate threshold voltage of the silicon carbide semiconductor device.

Although the embodiments are numbered with, for example, "first," "second," "third," "fourth," or "fifth," the ordinal numbers do not imply priorities of the embodiments. Many other variations and modifications will be apparent to those skilled in the art.

Further, the present invention is not limited to these embodiments, but various variations, modifications, and substitutions may be made without departing from the scope of the present invention.

What is claimed is:

1. A silicon carbide semiconductor device comprising:
    a silicon carbide substrate;
    a gate insulating layer provided on a first surface of the silicon carbide substrate;
    a gate electrode provided on the gate insulating layer;
    a first insulting layer provided on the gate electrode;
    a first layer provided on the first insulating layer;
    a second layer provided on the first layer;
    a third layer provided on the second layer;
    a second insulating layer provided on the first insulating layer; and
    an interconnect layer provided on the second insulating layer,
    wherein the second insulating layer is provided on the third layer,
    wherein the second insulating layer includes SiN or SiON, wherein the first layer includes one of Ti, TiN, Ta, and TaN,
wherein the second layer includes Ni or TiAlSi,
wherein the third layer includes one of Ti, TiN, Ta, and TaN, and
wherein the interconnect layer includes Al or Cu.

2. The silicon carbide semiconductor device as claimed in claim 1, wherein
the first layer has a thickness of 33 nm or greater and 120 nm or less, and
the third layer has a thickness of 5 nm or greater and 30 nm or less.

3. The silicon carbide semiconductor device as claimed in claim 2, wherein
the first layer includes one of Ti, TiN, and a laminated layer of Ti and TiN,
wherein the second layer includes Ni, and
the third layer includes one of Ti, TiN, and a laminated layer of Ti and TiN.

4. The silicon carbide semiconductor device as claimed in claim 2, further comprising:
a source electrode, including an alloy layer of Ni and Si, and provided on the first surface of the silicon carbide substrate.

5. The silicon carbide semiconductor device as claimed in claim 2, further comprising:
a gate trench provided on the first surface of the silicon carbide substrate,
wherein the gate insulating layer is provided on an inner wall of the gate trench, and
wherein the gate electrode is provided on the gate insulating layer at the gate trench.

6. The silicon carbide semiconductor device as claimed in claim 1, wherein
the first layer includes one of Ti, TiN, and a laminated layer of Ti and TiN,
wherein the second layer includes Ni, and
the third layer includes one of Ti, TiN, and a laminated layer of Ti and TiN.

7. The silicon carbide semiconductor device as claimed in claim 6, further comprising:
a source electrode, including an alloy layer of Ni and Si, and provided on the first surface of the silicon carbide substrate.

8. The silicon carbide semiconductor device as claimed in claim 6, further comprising:
a gate trench provided on the first surface of the silicon carbide substrate,
wherein the gate insulating layer is provided on an inner wall of the gate trench, and
wherein the gate electrode is provided on the gate insulating layer at the gate trench.

9. The silicon carbide semiconductor device as claimed in claim 1, further comprising:
a source electrode, including an alloy layer of Ni and Si, and provided on the first surface of the silicon carbide substrate.

10. The silicon carbide semiconductor device as claimed in claim 1, further comprising:
a gate trench provided on the first surface of the silicon carbide substrate,
wherein the gate insulating layer is provided on an inner wall of the gate trench, and
wherein the gate electrode is provided on the gate insulating layer at the gate trench.

11. The silicon carbide semiconductor device as claimed in claim 1, further comprising:
a drain electrode provided on a second surface of the silicon carbide substrate, opposite to the first surface provided with the gate electrode.

12. A silicon carbide semiconductor device comprising:
a silicon carbide substrate;
a gate insulating layer provided on a first surface of the silicon carbide substrate;
a gate electrode provided on the gate insulating layer;
a first insulting layer provided on the gate electrode;
a first layer provided on the first insulating layer;
a second layer provided on the first layer;
a second insulating layer provided on the first insulating layer; and
an interconnect layer provided on the second insulating layer,
wherein the second insulating layer is provided on the second layer,
wherein the first layer includes one of Ti, TiN, Ta, and TaN,
wherein the second layer includes one of Ti, TiN, Ta, and TaN,
wherein the second insulating layer includes SiN or SiON, and
wherein the interconnect layer includes Al or Cu.

13. The silicon carbide semiconductor device as claimed in claim 12, further comprising:
a source electrode, including an alloy layer of Ni and Si, and provided on the first surface of the silicon carbide substrate.

14. The silicon carbide semiconductor device as claimed in claim 12, further comprising:
a gate trench provided on the first surface of the silicon carbide substrate,
wherein the gate insulating layer is provided on an inner wall of the gate trench, and
wherein the gate electrode is provided on the gate insulating layer at the gate trench.

15. A silicon carbide semiconductor device comprising:
a silicon carbide substrate;
a gate insulating layer provided on a first surface of the silicon carbide substrate;
a gate trench provided on the first surface of the silicon carbide substrate;
a gate electrode provided on the gate insulating layer;
a first insulting layer provided on the gate electrode;
a first layer provided on the first insulating layer;
a second insulating layer provided on the first insulating layer; and
an interconnect layer provided on the second insulating layer,
wherein the gate insulating layer is provided on an inner wall of the gate trench,
wherein the gate electrode is provided on the gate insulating layer at the gate trench,
wherein the first layer includes one of Ti, TiN, Ta, and TaN,
wherein the second insulating layer includes SiN or SiON, and
wherein the interconnect layer includes Al or Cu.

16. The silicon carbide semiconductor device as claimed in claim 15, further comprising;
a drain electrode provided on a second surface of the silicon carbide substrate, opposite to the first surface provided with the gate electrode.

17. A silicon carbide semiconductor device comprising:
a silicon carbide substrate;

a gate insulating layer provided on a first surface of the silicon carbide substrate;
a gate electrode provided on the gate insulating layer;
a first insulting layer provided on the gate electrode;
a first layer provided on the first insulating layer;
a second insulating layer provided on the first insulating layer;
an interconnect layer provided on the second insulating layer; and
a drain electrode provided on a second surface of the silicon carbide substrate, opposite to the first surface provided with the gate electrode,
wherein the first layer includes one of Ti, TiN, Ta, and TaN,
wherein the second insulating layer includes SiN or SiON, and
wherein the interconnect layer includes Al or Cu.

18. The silicon carbide semiconductor device as claimed in claim 17, further comprising:
a source electrode, including an alloy layer of Ni and Si, and provided on the first surface of the silicon carbide substrate.

19. The silicon carbide semiconductor device as claimed in claim 18, further comprising:
a gate trench provided on the first surface of the silicon carbide substrate,
wherein the gate insulating layer is provided on an inner wall of the gate trench, and
wherein the gate electrode is provided on the gate insulating layer at the gate trench.

* * * * *